United States Patent
Oida et al.

(10) Patent No.: US 6,853,077 B2
(45) Date of Patent: Feb. 8, 2005

(54) SEMICONDUCTOR DEVICE, SEMICONDUCTOR PACKAGING METHOD, ASSEMBLY AND METHOD FOR FABRICATING THE SAME

(75) Inventors: Seishi Oida, Kyoto (JP); Sigeki Sakaguchi, Kyoto (JP); Koji Ohmori, Shiga (JP); Kenrou Jitumori, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 45 days.

(21) Appl. No.: 10/260,400

(22) Filed: Oct. 1, 2002

(65) Prior Publication Data

US 2003/0089923 A1 May 15, 2003

(30) Foreign Application Priority Data

Oct. 1, 2001 (JP) ........................................ 2001-305480
Jan. 29, 2002 (JP) ........................................ 2002-020762

(51) Int. Cl.$^7$ .............................................. H01L 23/48
(52) U.S. Cl. ........................ 257/738; 257/771; 257/772; 257/782; 257/783; 420/557; 75/255; 174/52.4
(58) Field of Search ................................ 257/771, 772, 257/782, 783; 420/557; 75/255; 174/52.4

(56) References Cited

U.S. PATENT DOCUMENTS

| | | | |
|---|---|---|---|
| 4,042,725 A | | 8/1977 | Nomaki et al. |
| 6,361,626 B1 | | 3/2002 | Kitajima et al. |
| 6,517,602 B2 | * | 2/2003 | Sato et al. ................... 75/255 |
| 6,563,225 B2 | * | 5/2003 | Soga et al. ................ 257/782 |
| 6,657,124 B2 | * | 12/2003 | Ho ............................ 174/52.4 |
| 6,673,310 B2 | * | 1/2004 | Tadauchi et al. ............ 420/557 |

FOREIGN PATENT DOCUMENTS

| | | |
|---|---|---|
| EP | 0 991 119 A1 | 4/2000 |
| JP | 55-36032 B2 | 3/1980 |
| JP | 57011793 A | 1/1982 |
| JP | 59042197 A | 3/1984 |
| JP | 6-344181 | 12/1994 |
| JP | 7-155984 | 6/1995 |
| JP | 8-323495 | 12/1996 |
| JP | 9-19792 | 1/1997 |
| JP | 09206983 A | 8/1997 |
| JP | 10-032307 A | 2/1998 |
| JP | 10-163270 | 6/1998 |
| JP | 2000-015478 A | 1/2000 |
| JP | 2000-326088 A | 11/2000 |
| JP | 2000-332403 A | 11/2000 |
| JP | 2001-118959 A | 4/2001 |
| JP | 2001-150179 A | 6/2001 |
| JP | 2001-156207 A | 6/2001 |
| JP | 2001-156207 | 8/2001 |
| JP | 2002-313983 | 10/2002 |
| WO | WO 02/34969 A1 | 5/2002 |

OTHER PUBLICATIONS

Seishi Oida et al., "reliability of Lead–Free Soldering BGA for Law Reflow Temperature", $8^{th}$ Symposium on Microjoining and Assembly Technology in Electronics:, pp. 253–256, Jan. 31, 2002.

Copy of International Search Report dated Dec. 25, 2001 for case PCT/JP01/08399.

* cited by examiner

Primary Examiner—David Nelms
Assistant Examiner—Mai-Huong Tran
(74) Attorney, Agent, or Firm—McDermott Will & Emery LLP

(57) ABSTRACT

A semiconductor device includes a semiconductor element having a plurality of element electrodes and a ball electrode electrically connected to at least one element electrode out of the plurality of element electrodes. The ball electrode is made of a Sn—Zn-based lead-free solder including 7 through 9.5 wt % of zinc and the remaining of tin.

22 Claims, 30 Drawing Sheets

US 6,853,077 B2

SEMICONDUCTOR DEVICE, SEMICONDUCTOR PACKAGING METHOD, ASSEMBLY AND METHOD FOR FABRICATING THE SAME

BACKGROUND OF THE INVENTION

The present inventions relates to a semiconductor device, a semiconductor packaging method and a method for fabricating an assembly, and more particularly, it relates to a BGA (ball grid array) type semiconductor device in which a plurality of ball electrodes are two-dimensionally arranged.

Solder joint is indispensable in a semiconductor device and a package substrate using the semiconductor device. Even today, a tin-lead eutectic solder is widely used. The tin-lead eutectic solder is used for the solder joint for the following reasons:

First, the tin-lead eutectic solder has a low eutectic point. The tin-lead eutectic solder reaches its melting point at a temperature lower than the heat resistant temperature of not only a semiconductor device itself but also a printed board used in the substrate packaging. Therefore, when the tin-lead eutectic solder is used, the solder joint can be obtained without thermally damaging the semiconductor device and the printed board. In addition, the tin-lead eutectic solder has high soldering reliability. In order to secure the definite operation of the device, high soldering reliability is significant.

However, in consideration of terrestrial environmental problems currently discussed, products including lead are now reconsidered to be replaced. Specifically, lead is eluted from such products owing to acid rain and pollutes ground water, and drinking of this polluted water is said to cause blood disorder or central nervous disorder in a human body. Therefore, a solder not including lead is attracting attention.

A solder not including lead (hereinafter referred to as the "lead-free solder") has been earnestly studied these several years, and a substantially limitless kinds of solders resulting from combinations of a variety of components and their mixing ratios have been developed. Accordingly, the composition of a solder used by a manufacturer of semiconductor devices, that is, a supplier of semiconductor devices, is occasionally different from the composition of a solder used by a set assembler, that is, a receiver of the semiconductor devices.

Even when the compositions of the used solders are different, if the amount of the solder used on a semiconductor device is very small and much smaller than the amount of a solder cream used on a set substrate as in, for example, electroplating, it is said that the different compositions of the solders minimally cause harmful influence. However, in the case of, for example, a ball grid array package (hereinafter referred to as the "BGA package") having a solder ball electrode, the mass and the volume of the solder ball electrode are substantially the same as those of the cream solder used on a package substrate. Therefore, the resultant package seems to be largely influenced by the different compositions of the solders. Specifically, since the different solders have different melting points, air contamination is caused between the solder electrode and the cream solder on the package substrate during the solder joint of the BGA package performed in a reflow furnace, and the contamination leads to voids, resulting in lowering the soldering reliability.

At present, with respect to the lead-free solders, various studies and examinations are made on Sn—Ag—Cu-based solders in particular, and Sn—Ag—Cu—Bi-based solders are also studied and examined. Also, a cream solder made of such a lead-free solder has been put to practical use, and a solder metal ball made of a Sn—Ag—Cu-based solder has been developed. On the other hand, apart from the Sn—Ag—Cu-based solders and Sn—Ag—Cu—Bi-based solders earnestly studied and examined, examinations are being made also on Sn—Zn-based solders, which have an advantage of a comparatively low melting point although they are disadvantageously easily oxidized, and a cream solder made of a Sn—Zn-based solder has been developed. However, a solder metal ball electrode made of a Sn—Zn-based solder has not been realized yet.

SUMMARY OF THE INVENTION

The present inventions were devised in consideration of the aforementioned situations, and a principal object of the invention is realizing a semiconductor device including a lead-free ball electrode capable of being soldered at a lower temperature and having high soldering reliability. Another object of the invention is providing a semiconductor packaging method and an assembly having high soldering reliability.

The first semiconductor device of the present inventions includes a semiconductor element having a plurality of element electrodes; and a ball electrode electrically connected to at least one element electrode out of the plurality of element electrodes, and the ball electrode is made of a Sn—Zn-based lead-free solder including 7 through 9.5 wt % of zinc and the remainder of tin.

The second semiconductor device of the present inventions includes a semiconductor element having a plurality of element electrodes; and a ball electrode electrically connected to at least one element electrode out of the plurality of element electrodes, and the ball electrode is made of a Sn—Zn-based lead-free solder including 7 through 9.5 wt % of zinc, 1 through 5 wt % of bismuth and the remainder of tin.

The third semiconductor device of the present inventions includes a semiconductor element having a plurality of element electrodes; and a ball electrode electrically connected to at least one element electrode out of the plurality of element electrodes, and the ball electrode is made of a Sn—Zn-based lead-free solder including 7 through 9.5 wt % of zinc, 1 through 5 wt % of indium and the remainder of tin.

The fourth semiconductor device of the present inventions includes a semiconductor element having a plurality of element electrodes; and a ball electrode electrically connected to at least one element electrode out of the plurality of element electrodes, and the ball electrode is made of a Sn—Zn-based lead-free solder including 7 through 9.5 wt % of zinc, 1 through 4 wt % of bismuth, 1 through 4 wt % of indium and the remainder of tin.

The fifth semiconductor device of the present inventions includes a semiconductor element having a plurality of element electrodes; and a ball electrode electrically connected to at least one element electrode out of the plurality of element electrodes, and the ball electrode is made of a lead-free solder, and the lead-free solder has a melting point of 180° C. through 200° C.

In one aspect, the lead-free solder is an alloy having a liquid-solid coexistence region in a phase diagram thereof.

In one aspect, a plurality of ball electrodes including the above-described ball electrode are two-dimensionally arranged on a packaging face used for packaging the semiconductor device on a package substrate.

Each of ball electrodes positioned at least in the center out of the plurality of two-dimensionally arranged ball electrodes is preferably the above-described ball electrode.

In one aspect, all of the plurality of two-dimensionally arranged ball electrodes are the above-described ball electrode.

In one aspect, the ball electrode and the at least one element electrode are electrically connected to each other through a wiring board, the semiconductor element is mounted on a top face of the wiring board, and the ball electrode is provided on a rear face of the wiring board.

In one aspect, a plurality of wiring electrodes are formed on the top face of the wiring board, the plurality of element electrodes are formed on a face of the semiconductor element used for mounting onto the wiring board, and each of the plurality of element electrodes is electrically connected to a corresponding one of the plurality of wiring electrodes through a projecting electrode.

In one aspect, a plurality of wiring electrodes are formed on the top face of the wiring board, the plurality of element electrodes are formed on a face of the semiconductor element other than the face used for mounting onto the wiring board, and each of the plurality of element electrodes is electrically connected to a corresponding one of the plurality of wiring electrodes through a metal wire.

In one aspect, the wiring board is made of an organic material, the wiring board has, on the rear face, a rear electrode formed in a position corresponding to the ball electrode, and the rear electrode has a fluxed surface or a surface covered with nickel plating and gold plating stacked in this order.

In one aspect, the wiring board is made of a ceramic material, the wiring board has, on the rear face, a rear electrode in a position corresponding to the ball electrode, and nickel plating and gold plating are stacked in this order on the rear electrode with the ball electrode placed on top.

In one aspect, an insulating layer is formed on a principal face of the semiconductor element, where the plurality of element electrodes are formed, with the plurality of element electrodes exposed, an interconnect layer electrically connected to at least one of the plurality of element electrodes is formed on the insulating layer, and the ball electrode is placed in a part of the wiring layer.

The insulating layer is preferably an elastic layer made of a low elastic resin.

In one aspect, the ball electrode and the at least one element electrode are electrically connected through a copper or iron lead frame, the semiconductor element is mounted onto a part of the lead frame, a rear electrode is formed on the lead frame in a position corresponding to the ball electrode, and the rear electrode has nickel plating, palladium plating and gold plating stacked in this order thereon with the ball electrode placed on top.

In one aspect, the ball electrode and the at least one element electrode are electrically connected through a copper or iron lead frame, the semiconductor element is mounted onto a part of the lead frame, a rear electrode is formed on the lead frame in a position corresponding to the ball electrode, and the rear electrode has alloy plating made of tin and bismuth thereon with the ball electrode placed on top.

The first semiconductor packaging method of the present inventions for reflow packaging a semiconductor device having a ball electrode on a package substrate, includes the steps of (a) applying a cream solder on a portion of a conducting wire provided on the package substrate around a position to be brought to contact with the ball electrode so as not to allow the cream solder to be in contact with the ball electrode when the ball electrode is in contact with the conducting wire; (b) bringing the ball electrode to contact with the conducting wire of the package substrate; and (c) allowing the semiconductor device and the package substrate to pass through a reflow furnace in a high temperature atmosphere, and the ball electrode is melted priorly to or simultaneously with the cream solder so as to solder the ball electrode to the conducting wire in the step (c).

The cream solder is preferably applied in a substantially ring shape on the conducting wire in the step (a).

The cream solder can be applied not continuously but so as to have at least one gap.

The second semiconductor packaging method of the present inventions for packaging a semiconductor device having a ball electrode on a package substrate, the ball electrode is made of a solder having a liquid-solid coexistence region, the package substrate has a conducting wire with a metal protrusion, and the semiconductor packaging method includes a step of thrusting the metal protrusion into the ball electrode, whereby soldering the ball electrode without contaminating unwanted air.

In one aspect, the ball electrode is made of a lead-free solder.

The third semiconductor packaging method of the present inventions for packaging a semiconductor device having a ball electrode on a package substrate, includes the steps of preparing any of the first through fifth semiconductor devices; applying a cream solder made of a Sn—Zn-based lead-free solder on a conducting wire provided on the package substrate; bringing the ball electrode to contact with the cream solder; and allowing the semiconductor device and the package substrate to pass through a reflow furnace in a high temperature atmosphere.

The conducting wire on which the cream solder is applied preferably has nickel plating and gold plating stacked in this order thereon.

The first method of the present inventions for fabricating an assembly in which a BGA type semiconductor device having a plurality of two-dimensionally arranged ball electrodes is mounted on a package substrate having wire electrodes respectively corresponding to the plurality of ball electrodes, includes the steps of preparing the BGA type semiconductor device in which the plurality of ball electrodes are made of a lead-free solder having a melting point of 180° C. through 200° C. and the package substrate; applying a cream solder on each of the wire electrodes in a substantially ring shape so as not to allow each of the plurality of ball electrodes to be in contact with the cream solder when the plurality of ball electrodes of the semiconductor device are in contact with the wire electrodes; bringing the plurality of ball electrodes of the semiconductor device to contact with the wire electrodes, respectively; and soldering the plurality of ball electrodes by melting the plurality of ball electrodes priorly to or simultaneously with the cream solder.

The second method of the present inventions for fabricating an assembly in which a BGA type semiconductor device having a plurality of two-dimensionally arranged ball electrodes is mounted on a package substrate having wire electrodes respectively corresponding to the plurality of ball electrodes, includes the steps of preparing the BGA type semiconductor device in which the plurality of ball electrodes are made of a lead-free solder with a liquid-solid coexistence region in a phase diagram thereof, preparing the package substrate in which metal protrusions are respectively provided on the wire electrodes; and soldering the plurality of ball electrodes of the semiconductor device by respectively thrusting the metal protrusions into the plurality of ball electrodes with the plurality of ball electrodes in contact with the wire electrodes, respectively.

The first assembly of the present inventions includes a semiconductor device having a ball electrode mounted on a package substrate, and the semiconductor device is any of the first through fifth semiconductor devices, the package substrate has a conducting wire disposed correspondingly to the ball electrode of the semiconductor device, the semiconductor device and the package substrate are electrically connected to each other through a cream solder applied on the conducting wire and a solder ball formed by melting the ball electrode of the semiconductor device, and the cream solder is made of a Sn—Zn-based lead-free solder.

The second assembly of the present inventions includes a semiconductor device having a ball electrode mounted on a package substrate, and the semiconductor device is any of the first through fifth semiconductor devices, the package substrate has a conducting wire disposed correspondingly to the ball electrode of the semiconductor device, the semiconductor device and the package substrate are electrically connected to each other through a cream solder applied on the conducting wire and a solder ball formed by melting the ball electrode of the semiconductor device, and the solder ball is made of a Sn—Zn-based lead-free solder.

In one aspect, the solder ball includes at least tin and zinc but substantially none of lead, silver and copper.

In one aspect, the solder ball can further include at least one of bismuth and indium.

The third assembly of the present inventions includes a semiconductor device having a ball electrode packaged on a packaged substrate, and the semiconductor device is any of the first through fifth semiconductor devices, the ball electrode of the semiconductor device is electrically connected to the at least one element electrode through a printed board, the ball electrode is disposed on a rear face of the printed board, a rear electrode is provided on the rear face of the printed board in a position corresponding to the ball electrode, the rear electrode has nickel plating and gold plating stacked in this order thereon, the package substrate has a conducting wire disposed correspondingly to the ball electrode, and nickel plating and gold plating are stacked in this order in a portion of the conducting wire where a cream solder is to be applied.

The cream solder is preferably made of a Sn—Zn-based lead-free solder.

The semiconductor device of the present inventions includes the ball electrode made of a low melting point lead-free solder. Accordingly, the soldering can be performed at a lower temperature, so that the thermal damage on the semiconductor device can be prevented and that the lowering of the soldering reliability can be avoided. Also, according to the invention, the soldering can be performed without contaminating unwanted air into the ball electrode in packaging the semiconductor device on the package substrate. Therefore, the resultant assembly can attain high soldering reliability.

Furthermore, in the case where the ball electrode of the semiconductor device is made of a Sn—Zn-based lead-free solder, the reliability of the assembly can be improved by fabricating it with the cream solder made of a Sn—Zn-based lead-free solder supplied onto the conducting wire provided on the package substrate. Moreover, in the case where at least one of the ball electrode and the cream solder is made of a Sn—Zn-based lead-solder, if the rear electrode and the conducting wire are covered with nickel plating and gold plating stacked in this order, the reliability of the assembly can be improved as compared with the case where they are pre-fluxed.

DETAILED DESCRIPTION OF THE INVENTION

Figure 1:
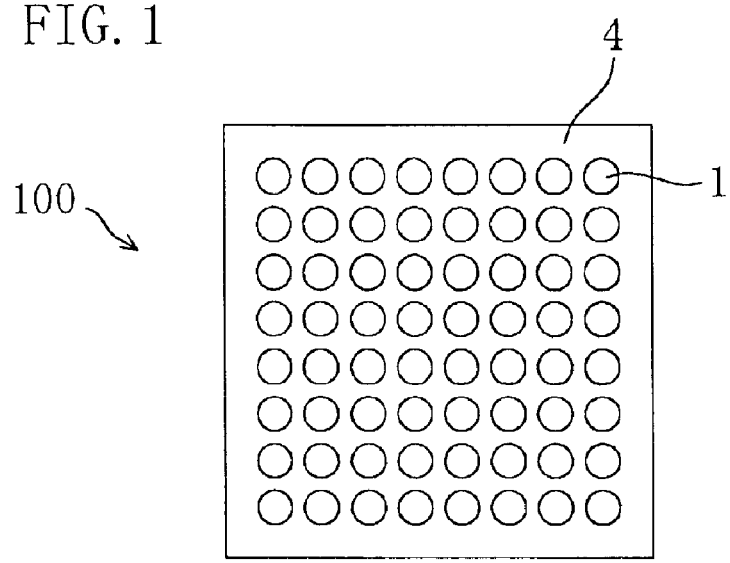
FIG. 1 is a bottom view for schematically showing the rear face of a semiconductor device according to Embodiment 1 of the present inventions.

Preferred embodiments of the invention will now be described with reference to the accompanying drawings. In these drawings, like reference numerals are used to refer to like elements for the sake of simplification. It should be noted that the invention is not limited to the embodiments specifically described below.

Embodiment 1

Figure 2:
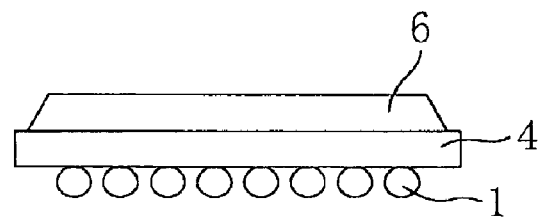
FIG. 2 is a side view for schematically showing the side face of the semiconductor device of Embodiment 1.
Figure 3:
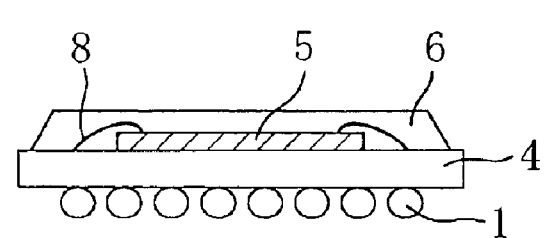
FIG. 3 is a cross-sectional view for schematically showing the cross-section of the semiconductor device of Embodiment 1.

FIGS. 1 through 3 schematically show the structure of a semiconductor device 100 according to Embodiment 1 of the invention. FIG. 1 is a bottom view of the semiconductor device 100 seen from its face having ball electrodes 1, FIG. 2 is a side view thereof and FIG. 3 is a cross-sectional view of FIG. 2.

The semiconductor device 100 of this embodiment is a BGA (ball grid array) type semiconductor device on which a plurality of ball electrodes are two-dimensionally arranged, that is, what is called a BGA package. The semiconductor device 100 includes a semiconductor element (semiconductor chip or an IC chip) 5 in which a semiconductor integrated circuit is formed, and at least one of a plurality of element electrodes (not shown) provided on the semiconductor element 5 is electrically connected to at least one of the plural ball electrodes 1. The ball electrodes 1 also work as a buffer for canceling thermal stress caused by a difference in the thermal expansion coefficient between the semiconductor device 100 and a package substrate (such as a printed board).

In this embodiment, the semiconductor element 5 is disposed on a wiring board (interposer) 4 for electrically connecting the semiconductor element 5 to the ball electrodes 1. The wiring board 4 is made of an organic material and is, for example, a plastic board (such as an epoxy board). On the rear face of the wiring board 4 other than the face where the semiconductor element 5 is disposed, a plurality of rear electrodes (lands) are formed, so that the ball electrodes 1 can be respectively placed on the rear electrodes. The rear face of the wiring board 4 where the ball electrodes 1 are arranged corresponds to a packaging face for packaging the semiconductor device 100 on a package substrate (not shown).

On the top face of the wiring board 4, a plurality of surface electrodes (not shown) are formed, and at least one of the plural surface electrodes is electrically connected to at least one of the plural element electrodes of the semiconductor element 5 through a metal wire 8. The metal wires 8 are formed so as to connect the element electrodes to the surface electrodes through wire bonding. On the top face of the wiring board 4, a mold material (such as a mold resin) 6 is formed so as to cover the semiconductor element 5 and the metal wires 8. At least one of the plural surface electrodes of the wiring board 4 is electrically connected to at least one of the plural rear electrodes, so that the ball electrode 1 can be electrically connected to the semiconductor element 5 via the wiring board 4.

Each ball electrode 1is made of a lead-free solder having a melting point of 180° C. through 200° C. A lead-free solder substantially does not include lead (with a permissible Pb content of approximately 0.10 mass %). The ball electrode 1 of this embodiment is made of any of lead-free solders respectively having the following compositions:

(1) A Sn—Zn-based lead-free solder including 7 through 9.5 wt % of zinc and the remainder of tin (binary solder);

(2) a Sn—Zn-based lead-free solder including 7 through 9.5 wt % of zinc, 1 through 5 wt % of bismuth and the remainder of tin (ternary solder including Bi);

(3) a Sn—Zn-based lead-free solder including 7 through 9.5 wt % of zinc, 1 through 5 wt % indium and the remainder of tin (ternary solder including In); and (4) a Sn—Zn-based lead-free solder including 7 through 9.5 wt % of zinc, 1 through 4 wt % of bismuth, 1 through 4 wt % of indium and the remainder of tin (quaternary solder).

The melting points of these Sn—Zn-based lead-free solders are 180° C. through 200° C. (specifically, approximately 190° C.), which is much lower than the melting point of a Sn—Ag—Cu-based lead-free solder (of approximately 218° C.) and the melting point of a Sn—Ag—Cu—Bi-based lead-free solder (of approximately 215° C.).

In general, the melting point of a lead-free solder is higher than that of a conventional tin-lead eutectic solder, and hence, the soldering using the lead-free solder should be carried out at a temperature higher than usual. Such a high temperature processing thermally damages a semiconductor device. Furthermore, an intermetallic compound in a soldered portion may be changed by the high temperature, so that the soldering reliability may be lowered. The cause of the soldering reliability lowered through the high temperature processing is still unclear but it is obvious from the result of an experiment made by the present inventors that the soldering strength depends upon the reflow temperature.

Figure 4:
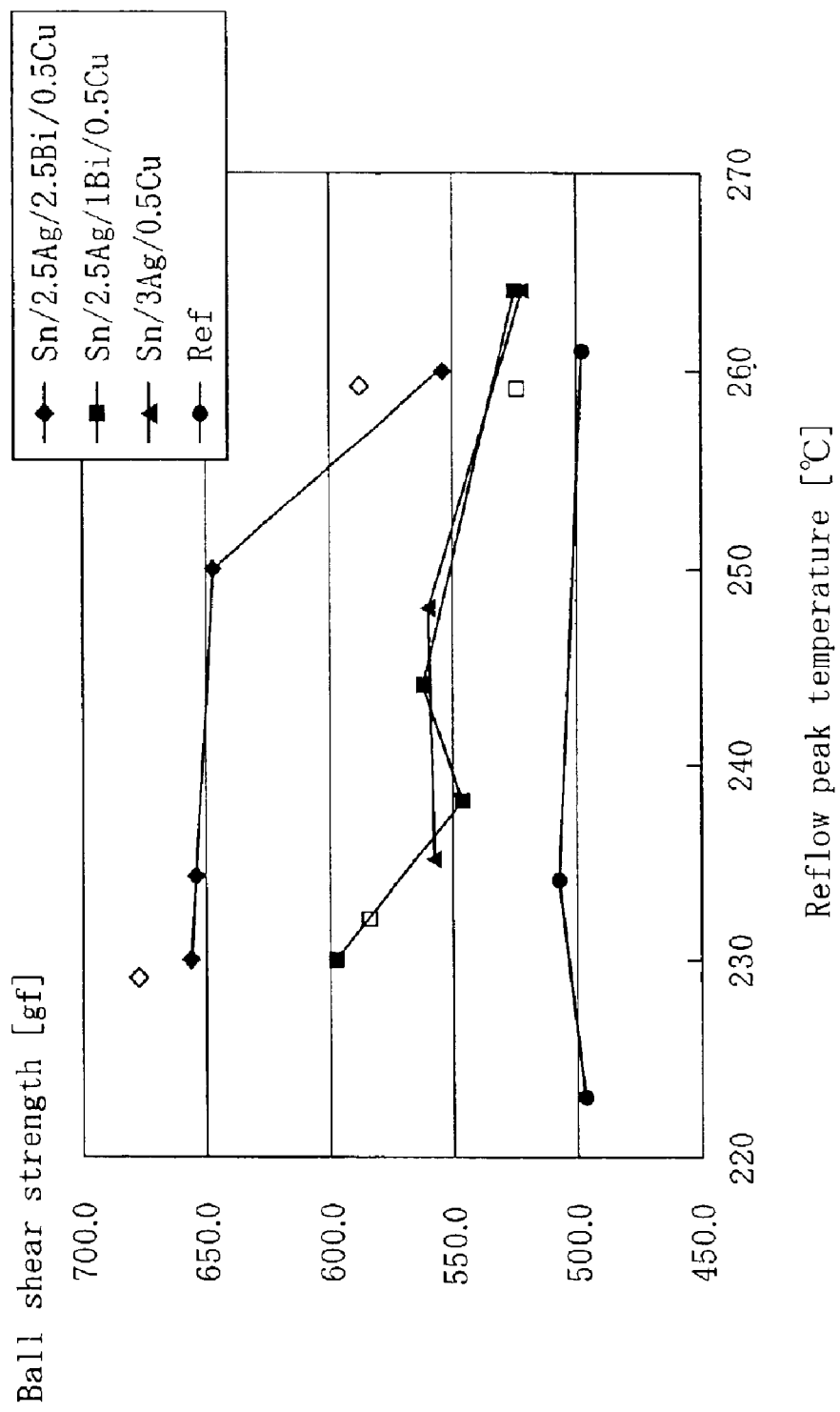
FIG. 4 is a graph for showing the relationship between the ball shear strength and the reflow peak temperature.

The result of the experiment made by the present inventors is shown in FIG. 4, which is a graph for showing the relationship between the ball shear strength [gf] corresponding to the soldering strength and the reflow peak temperature [° C.]. A line shown as a reference (Ref) in the graph indicates the relationship obtained in using the tin-lead eutectic solder. A lead-free solder shown in the uppermost portion as "Sn/2.5Ag/2.5Bi/0.5Cu" means that the lead-free solder includes 2.5 wt % of silver, 2.5 wt % of bismuth, 0.5 wt % of copper and the remainder of tin. The other lead-free solders are shown with similar expressions. As is understood from FIG. 4, there is no reflow temperature dependency in the tin-lead eutectic solder but there is reflow temperature dependency in the lead-free solders.

The lead-free solder used for the ball electrode 1 of this embodiment has a melting point of 180° C. through 200° C., and hence, the thermal damage on the semiconductor device can be largely reduced as compared with the other lead-free solders. Also, since this lead-free solder can be melted at a temperature lower than the other lead-free solders, the change of the intermetallic compound at the soldered portion can be suppressed, so that the lowering of the soldering reliability can be suppressed or reduced. In other words, since the semiconductor device 100 of this embodiment includes the ball electrodes 1 having the melting point of 180° C. through 200° C., the ball electrodes 1 are melted at a low temperature during the soldering of the ball electrodes 1 disposed on the rear face of the semiconductor device 100. Therefore, the thermal damage on the semiconductor device 100 can be prevented, and in addition, the lowering of the soldering reliability derived from the change of the intermetallic compound at the soldered portion can be avoided.

The lead-free solder used for the ball electrodes 1 is not limited to the above-described Sn—Zn-based solders (1) through (4) but may be another Sn—Zn-based lead-free solder or another lead-free solder apart from the Sn—Zn-based solders as far as it has a melting point of 180° C. through 200° C. Furthermore, differently from a ball electrode of a Sn—Ag—Cu-based lead-free solder, the ball electrode made of the Sn—Zn-based lead-free solder cannot be fabricated by the generally employed granulation in oil. This is because the Sn—Zn-based lead-free solder is easily oxidized. Therefore, the ball electrode of the Sn—Zn-based lead-free solder should be prepared in a reducing atmosphere.

The characteristics of the Sn—Zn-based lead-free solders obtained through an experiment by the present inventors are listed in Table 1 below.

TABLE 1

| Solder Composition (wt %) | | | | Melting Point (° C.) | | Experiment Result | |
|---|---|---|---|---|---|---|---|
| Sn | Zn | Bi | In | Solidus Line | Liquidus Line | Strength | Wettability |
| Ternary (including Bi) | | | | | | | |
| Rest | 9 | 0 | 0 | 199 | 199 | High | Poor |
| Rest | 8 | 0 | 0 | 198 | 202 | High | Poor |
| Rest | 8 | 1 | 0 | 193 | 201 | High | Poor |
| Rest | 8 | 2 | 0 | 190 | 199 | High | Poor |
| Rest | 8 | 3 | 0 | 187 | 197 | High | Moderate |
| Rest | 8 | 4 | 0 | 181 | 192 | Moderate | Good |
| Rest | 8 | 5 | 0 | 179 | 193 | Low | Good |
| Rest | 8 | 6 | 0 | 178 | 194 | Low | Good |
| Rest | 8 | 7 | 0 | 172 | 197 | Low | Good |
| Ternary (including In) | | | | | | | |
| Rest | 8 | 0 | 1 | 187 | 193 | High | Poor |
| Rest | 8 | 0 | 2 | 185 | 191 | High | Poor |
| Rest | 8 | 0 | 3 | 181 | 187 | High | Moderate |
| Rest | 8 | 0 | 4 | 179 | 190 | Moderate | Good |
| Rest | 8 | 0 | 5 | 179 | 191 | Low | Good |
| Rest | 8 | 0 | 6 | 179 | 192 | Low | Good |
| Rest | 8 | 0 | 7 | 177 | 193 | Low | Good |
| Quaternary | | | | | | | |
| Rest | 8 | 1 | 0 | 190 | 193 | High | Poor |
| Rest | 8 | 1 | 1 | 185 | 191 | High | Poor |
| Rest | 8 | 1 | 2 | 180 | 189 | High | Moderate |
| Rest | 8 | 1 | 3 | 175 | 190 | Moderate | Good |
| Rest | 8 | 1 | 4 | 173 | 191 | Low | Good |

Table 1 shows the composition ratios (wt %), the solidus line and the liquidus line (° C.), the strength and the wettability obtained by the experiment of each solder. The uppermost solder in Table 1 is a solder including 9 wt % of zinc and the remainder of tin, which is eutectic of tin and zinc having a melting point of 200° C. or less. For simply expressing the composition of each lead-free solder, for example, a solder including 9 wt % of zinc and the remainder of tin is expressed as a Sn—9Zn solder, and similar expressions are used for the other lead-free solders.

The Sn—9Zn solder has no problem in its strength, and although the wettability is poor, the poor wettability is not a significant problem if it is used for the ball electrode 1. In the case where the wettability is desired to be improved, either or both of bismuth and indium is preferably added to the solder including tin and zinc. According to the experiment made by the present inventors, it has been found that there is a conflictual relationship between the strength and the wettability. Specifically, it has been found that the strength tends to be lowered but the wettability tends to be improved by adding bismuth and indium. As the material for the ball electrode 1, a lead-free solder having any of the following compositions is preferred: (a) (8.5 through 9.5)Zn—Sn; (b) (7.5 through 8.5)Zn—(1 through 4)Bi—Sn; (c) (7.5 through 9.5)Zn—(1 through 4)In—Sn; and (d) (7.5 through 8.5) Zn—(1 through 2)Bi—(1through 2)In. Any of the lead-free solders having the compositions (a) through (d) is suitably used as the material for the ball electrode 1 because the strength and the wettability stand together comparatively well.

The composition (a) is more preferably (8.8±0.2)Zn—Sn, the composition (b) is more preferably (8.0±0.2)Zn—(3±0.2)Bi—Sn, the composition (c) is more preferably (9.0±0.2)Zn—(1±0.2)In—Sn, and the composition (d) is more preferably (8.0±0.2)Zn—(1±0.2)Bi—(2±0.2)In—Sn.

Figure 5:
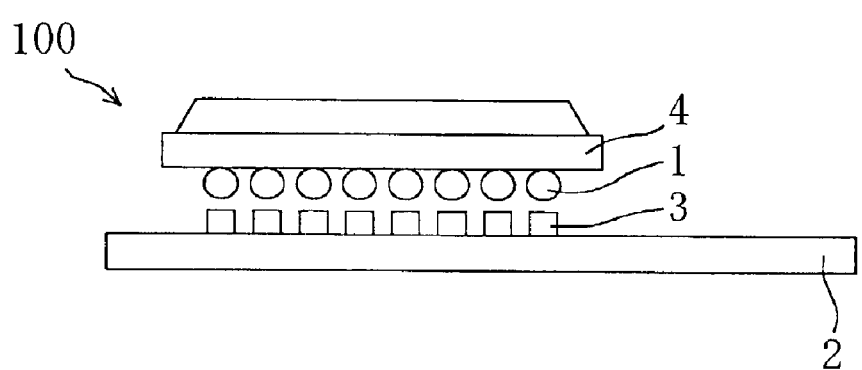
FIG. 5 is a side view of the semiconductor device of Embodiment 1 and a wiring board.

Next, FIG. 5 will be referred to. FIG. 5 schematically shows the semiconductor device 100 of this embodiment mounted on a package substrate 2. The package substrate 2 is, for example, a printed board, and a cream solder (in other words, a solder cream or a solder paste) 3 is applied on conducting lines of the package substrate 2 correspondingly to the ball electrodes 2. After mounting the semiconductor device 100 on the package substrate 2 with each cream solder 3 in contact with each ball electrode 1, the resultant is allowed to pass through a reflow furnace in a high temperature atmosphere. Thus, the packaging process is completed. The kind of cream solder 3 is not herein specified and may be a Sn—Pb-based solder, a Sn—Ag-based solder, a Sn—Zn-based solder or the like. From a viewpoint that the cream solder 3 preferably has the same melting temperature as the ball electrode 1, a solder with a similar composition to that of the ball electrode 1 (such as a Sn—Zn-based lead-free solder) is preferred and a solder with the same composition as that of the ball electrode 1 is more preferred.

Figure 6:
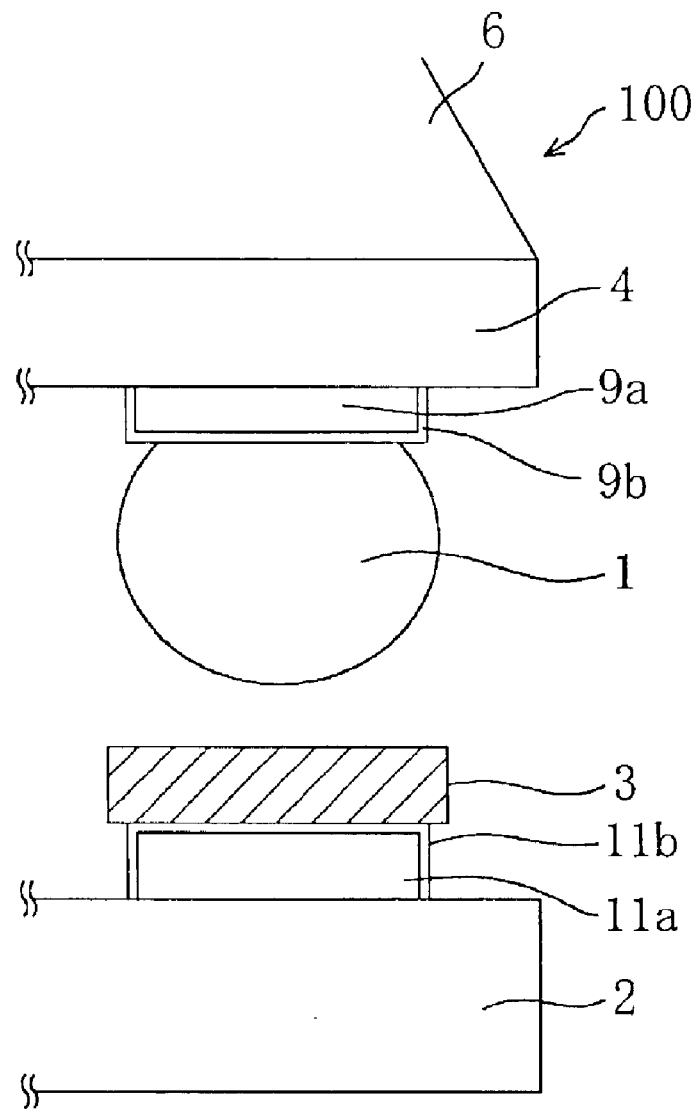
FIG. 6 is an enlarged view of principal parts of the semiconductor device of Embodiment 1 and the wiring board.

FIG. 6 is an enlarged view of a principal part of FIG. 5. Referring to FIG. 6, the detailed structure of the semiconductor device 100 of this embodiment will be exemplified as follows:

The semiconductor device (BGA package) 100 has a package size of 6 through 31 mm and a package thickness of 0.8 through 3.0 mm. A carrier substrate used for forming the wiring board 4 is, for example, a FR-4 or BT resin, having a base (core) with a thickness of 0.6 mm. A land 9$a$ serving as the wiring electrode (rear electrode) is principally made of copper. The land 9$a$ has a diameter φ of 0.2 through 0.7 mm and a thickness of 6 through 35 μm. In the structure exemplified in FIG. 6, the land 9$a$ is covered with plating 9$b$, which is principally made of Ni/Au. "Ni/Au" herein means that nickel plating and gold plating are successively stacked in the upward direction in this order. A flux applied to the solder ball 1 may be a resin type or water-soluble type flux. The solder ball 1 has a diameter of 0.25 through 0.76 mm.

Also, the package substrate 2 is exemplified as follows: The cream solder 3 is a Sn—37Pb-based, Sn—Ag-based or Sn—Zn-based cream solder (solder paste). The thickness (metal mask thickness) of the cream solder 3 is 0.1 through 0.15 mm. A land 11$a$ serving as a wiring electrode provided on the package substrate 2 is principally made of copper. The land 11$a$ has a diameter φ of 0.2 through 0.8 mm and a thickness of 6 through 35 μm. In the structure exemplified in FIG. 6, the land 11$a$ is covered with plating 11$b$, which is generally made of Ni/Au. Alternatively, the land 11$a$ may be treated with a flux alone without plating. The base of the package substrate 2 is an organic substrate. The package substrate 2 has a thickness of 0.8 through 1.6 mm. The package substrate 2 is a multi-layer board composed of 4 through 8 layers, and the wiring electrodes are provided on both faces of the package substrate 2.

Figure 7:
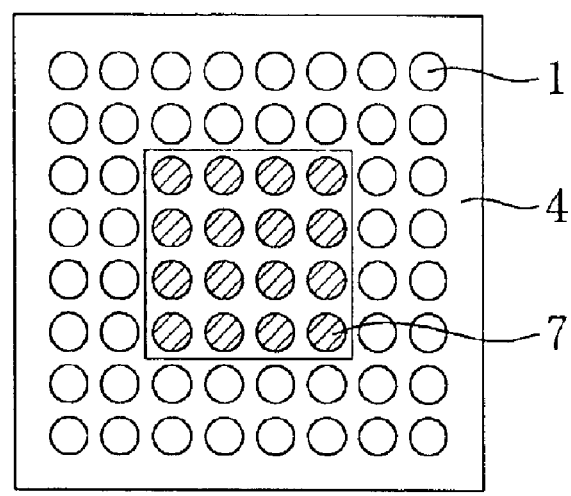
FIG. 7 is a bottom view for schematically showing the rear face of a semiconductor device according to a modification of Embodiment 1.

When the BGA package has a large dimension, sufficient heat sometimes cannot be transmitted to some ball electrodes 1 provided on the rear face of the wiring board 4, so that these ball electrodes 1 may remain unmelted. In the semiconductor device 100 of this embodiment, however, the ball electrodes 1 are made of the low melting point solder, and hence, this problem can be overcome. There is no need to use the low melting point solder for all of the plural ball electrodes arranged on the rear face of the wiring board 4 but the effect can be attained by using it for at least some of the ball electrodes. For example, the low melting point solder can be used for ball electrodes 1 disposed only in a region 7 in the vicinity of the center of the BGA package as shown in FIG. 7. The region 7 is considered as a region where heat is difficult to transmit. Therefore, the problem of the unmelted ball electrodes can be overcome by using the low melting point solder for the ball electrodes 1 disposed in this region alone.

Figure 8:
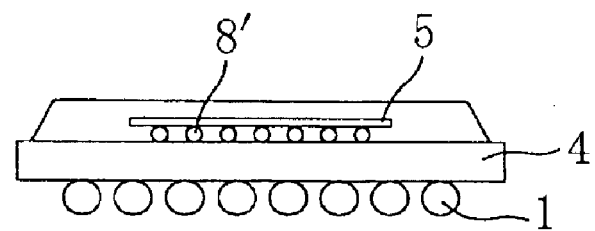
FIG. 8 is a cross-sectional view for schematically showing the cross-section of a semiconductor device according to another modification of Embodiment 1.

In the structure shown in FIG. 3, the top face of the wiring board 4 is adhered to the rear face of the semiconductor element 5 and the wiring electrodes provided on the top face of the wiring board 4 are electrically connected to the electrodes (element electrodes) of the semiconductor element 5 through the metal wires 8. The semiconductor device of this embodiment is, however, not limited to this structure. For example, the wiring electrodes provided on the top face of the wiring board 4 may be electrically connected to the electrodes (element electrodes) of the semiconductor element 5 through projecting electrodes 8' as shown in FIG. 8.

Figure 9:
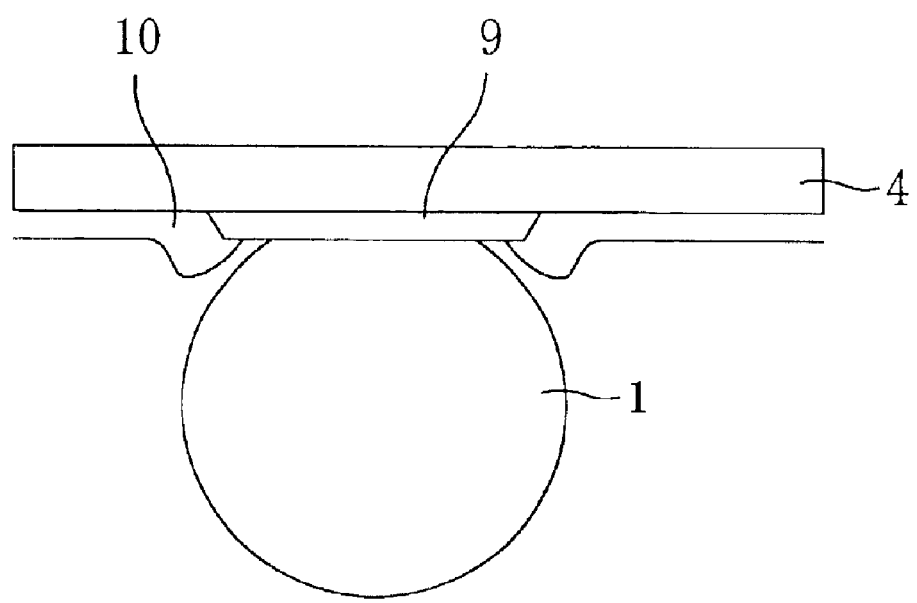
FIG. 9 is an enlarged view of a principal part around a ball electrode.

Also, on the rear face of the wiring board 4, a solder resist 10 covering a portion not necessary for electrical connection and exposing the center of the wiring electrode 9 where the ball electrode 1 is placed is preferably formed as shown in FIG. 9. The conducting wire 9 exposed in the opening of the solder resist 10 has a solid surface (or a fluxed surface) or a surface plated with, for example, nickel and gold. The ball electrode 1 is soldered onto the conducting wire 9.

Although the substrate made of an organic material is used for the wiring board 4 of the semiconductor device 100 shown in FIG. 1, a wiring board 4 made of ceramic as in a ceramic type semiconductor device may be used instead. The conditions for such a ceramic board will be exemplified referring to FIG. 6 as follows: The carrier substrate included in the wiring board 4 is made of ceramic having a base (core) with a thickness of approximately 0.4 mm. The land 9$a$ serving as the wiring electrode (rear electrode) is made of tungsten or molybdenum. The land 9$a$ has a diameter φ of 0.2 through 0.7 mm and a thickness of approximately 20 μm. In the case where the land 9$a$ is covered with the plating 9$b$, the plating 9$b$ is principally made of Ni/Au.

Alternatively, another interposer may be used as the wiring board 4. For example, a lead frame made of a copper-based or iron-based metal material may be used as in a lead frame type semiconductor device. In this case, the rear electrode is formed on a portion of the lead frame on which the ball electrode 1 is to be placed, and the ball electrode 1 can be soldered onto the rear electrode. The rear electrode is preferably covered with nickel plating, palladium plating and gold plating stacked in this order, and may be plated with tin and bismuth.

The conditions to be employed in the lead frame type semiconductor device are exemplified referred to FIG. 6 as follows: The carrier substrate constituting the wiring board 4 is made of copper or iron having a base (core) with a thickness of approximately 0.15 through 0.3 mm. The land 9$a$ serving as the wiring electrode (rear electrode) is made of copper or iron, and may be formed as a part of the lead frame. The land 9$a$ has a diameter φ of 0.2 through 0.7 mm and a thickness of 0.15 through 0.3 mm. In the case where the land 9$a$ is covered with the plating 9$b$, the plating 9$b$ is made of Ni/Pd/Au. "Ni/Pd/Au" herein means that nickel plating, palladium plating and gold plating are stacked in the upward direction in this order.

Figure 10A:
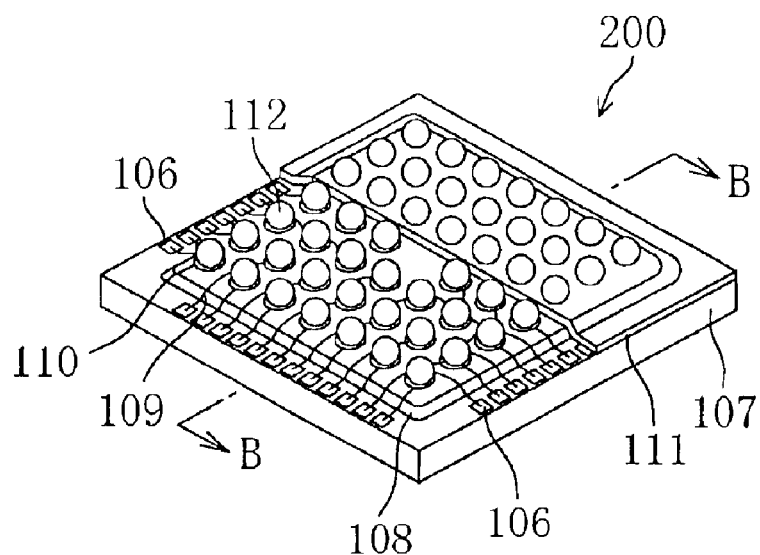
FIG. 10A is a perspective view for schematically showing a semiconductor device according to a modification of Embodiment 1 and FIG. 10B is a cross-sectional view taken along line B—B of FIG. 10A.
Figure 10B:
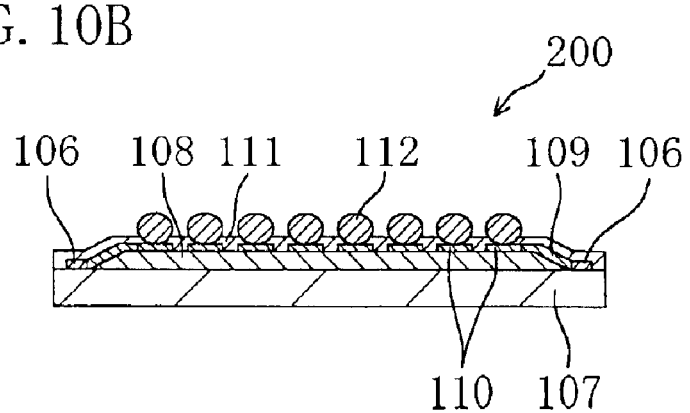

Further alternatively, the BGA package can be fabricated without using the wiring board 4. FIGS. 10A and 10B schematically show a semiconductor device 200 including a resin layer 108 formed on a semiconductor element (semiconductor chip) 107 without using the wiring board 4. FIG. 10A is a perspective and partly broken view of the semiconductor device 200 and FIG. 10B is a cross-sectional view taken along line B—B of FIG. 10A.

In the semiconductor device 200 of FIGS. 10A and 10B, lands 110 electrically connected to element electrodes 106 are provided on the resin layer 108 formed on the semiconductor element 107, and ball electrodes 112 are respectively placed on the lands 110. All or a part of the ball electrodes 112 can be the ball electrode 1 of this embodiment.

In more detail, the resin layer 108 is preferably an elastic layer made of a low elastic resin, and a solder resist 111 is preferably formed on the resin layer 108 so as to expose the lands 110. The land 110 is connected to the element electrode 106 through an interconnect layer 109. The interconnect layer 109 can be comparatively easily made to extend over the resin layer 108 by employing technique using the semiconductor fabrication process. Since a portion of the interconnect layer 109 extending from the element electrode 106 to the resin layer 108 can be easily disconnected, the resin layer 108 is preferably formed to be inclined (at an acute angle against the principal plane of the chip) in this portion. In the case where the elastic layer 108 is below the interconnect layer 109, even if stress such as thermal stress is applied to the interconnect layer 109 in heating/cooling the semiconductor device 200 for packaging the semiconductor device 200 on the package substrate 2, the stress applied to the interconnect layer 109 can be reduced by the elastic layer 108. Accordingly, the disconnection of the interconnect layer 109 can be prevented in the packaging and the like, so as to realize a highly reliable interconnect structure.

The elastic layer 108 has an elastic modulus (Young's modulus) of preferably 10 through 2000 kg/mm$^2$ and more preferably 10 through 1000 kg/mm$^2$. Also, the elastic layer 108 has a coefficient of linear expansion of preferably 5 through 200 ppm/° C. and more preferably 10 through 100 ppm/° C. The elastic layer 108 may be made of a polymer such as ester linkage polyimide and epoxy of the acrylate family as far as it has a low elastic modulus and an insulating property. The thickness is preferably 1 through 100 μm and more preferably 30 μm.

It goes without saying that the structure of this embodiment is not limited to those of the BGA type semiconductor device and is applicable to any semiconductor device including ball electrodes.

Next, the soldering strength of the ball electrode 1 used in the semiconductor device 100 (or 200) of this embodiment will be described. In order to evaluate the soldering strength of the ball electrode 1 of this embodiment, the present inventors have measured the shear strength of the ball electrode 1 through an experiment.

Figure 11:
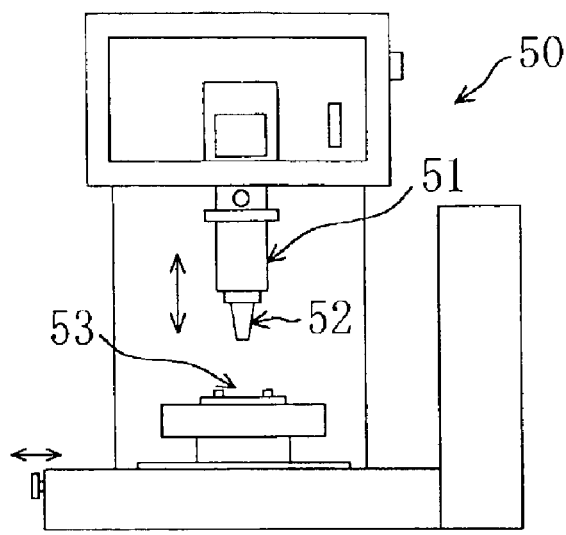
FIG. 11 is a schematic diagram for showing the structure of a shear strength measuring apparatus.

The shear strength is measured by using a shear strength measuring apparatus 50 (PTR-1000 manufactured by RHESCA Co. Ltd.) shown in FIG. 11. The shear strength measuring apparatus 50 includes a ball shear sensor 51 and a shear tool 52, which are vertically movable. A sample on which a ball electrode has been soldered is placed on a stage 53, which is horizontally movable.

Figure 12A:
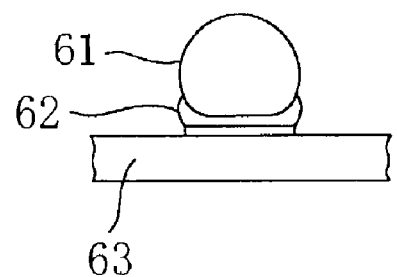
FIGS. 12A and 12B are procedure diagrams for explaining a method for measuring the shear strength.
Figure 12B:
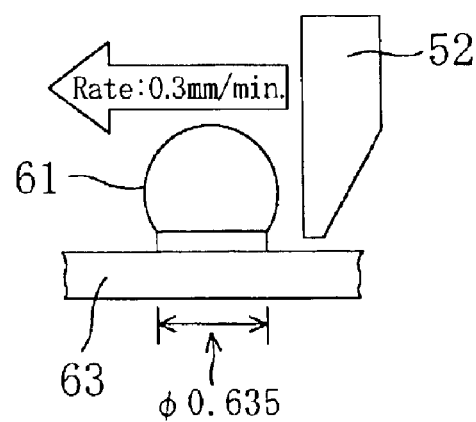

Referring to FIGS. 12A and 12B, the method for measuring the shear strength will be described. First, as shown in FIG. 12A, a solder ball (ball electrode) 61 is placed on a plate 63. At this point, before heating the plate 63, a cream solder or flux 62 is applied for preventing oxidation.

When the solder ball 61 is melted to be soldered onto the plate 63, the state as shown in FIG. 12B is obtained. The solder ball 61 has a diameter φ of approximately 0.8 mm, and a soldered portion to the ball 61 has a diameter φ of approximately 0.635 mm. Then, the plate 63 on which the solder ball 61 has been soldered is placed on the stage 53.

Next, the shear tool 52 is lowered until it is in contact with the surface of the plate 63 and the position of the surface of the plate 63 is identified by a tester. Thereafter, the shear tool 52 is raised by a predetermined distance (of approximately 0.1 through 0.2 mm).

Subsequently, the shear tool 52 is moved horizontally at a rate of 0.3 mm/min. and allowed to pass above the soldered portion with pressure applied to the solder ball 61 in a lateral direction. As a result, if part of the solder ball 61 remains on the plate 63, it is determined that the solder ball 61 has given or larger soldering strength. Also, on the basis of the measured shear strength (N), the soldering strength is determined.

Figure 13:
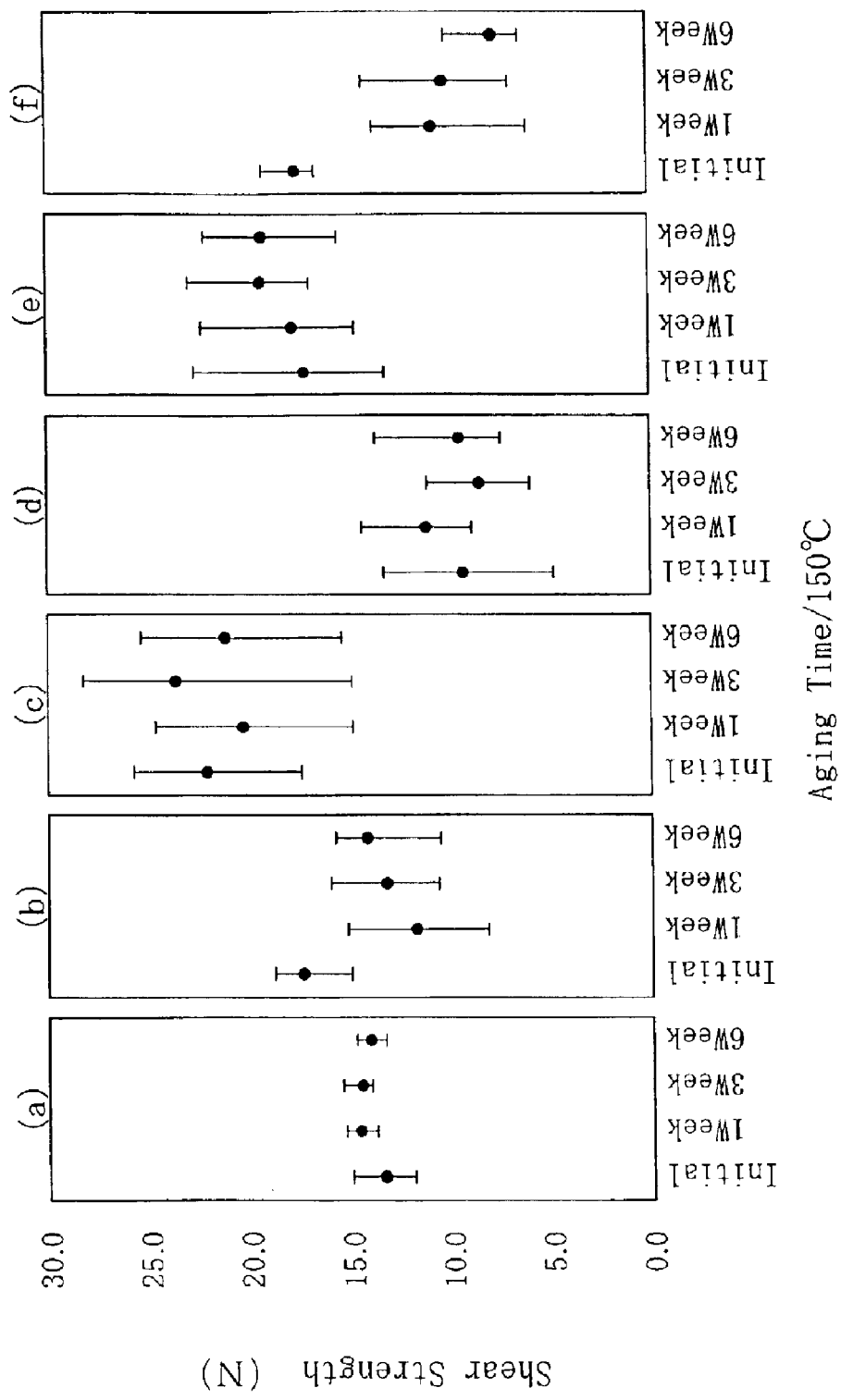
FIG. 13 is a graph of measured shear strengths.

The measurement results of the shear strength are shown in FIG. 13. These results are obtained by using the plate 63 plated with Ni and Au with merely the flux 62 applied. A sample (a) uses a Sn—37Pb solder ball, a sample (b) uses a Sn—3Ag—0.5Cu solder ball, a sample (c) uses a Sn—8Zn—3Bi solder ball, a sample (d) uses a Sn—0.2Bi solder ball, a sample (e) uses a Sn—2.5Ag—0.5Cu—1Bi solder ball, and a sample (f) uses a Sn—58Bi solder ball. The sample (c) corresponds to the lead-free solder of this embodiment. With respect to each of the samples, the shear strength is measured at the initial stage, after storage at 150° C. for one week, after storage at 150° C. for three weeks and after storage at 150° C. for six weeks. The minimum, maximum and average values of the shear strength indicated by N are shown in the drawing.

It has been understood from FIG. 13 that the sample (c) has higher shear strength than any other samples. In addition, the shear strength of the sample (c) was higher than any other sample at all the stages including the initial stage and six weeks after. At the initial stage, the minimum value of the shear strength of the sample (c) was 17.34 N, the maximum value was 25.65 N and the average value was 22.05 N (obtained by using data of twenty five samples). This means that the ball electrode 1 of this embodiment has high soldering strength and hence the semiconductor device 100 including the ball electrode 1 has high soldering reliability.

Embodiment 2

Embodiment 2 of the invention will now be described with reference to FIGS. 14 through 18. For the sake of simplification, description similar to that of Embodiment 1 is omitted or simplified.

Figure 14:
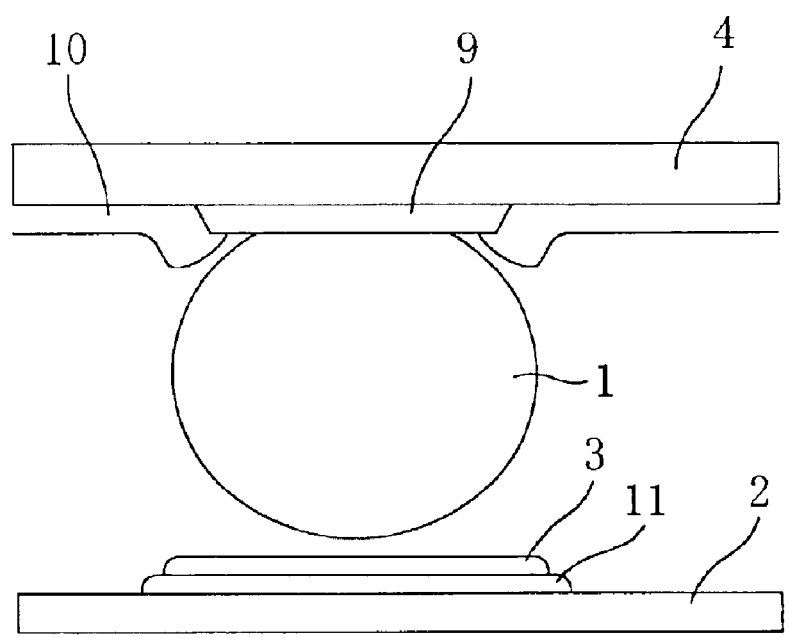
FIG. 14 is an enlarged view of a principal part around a ball electrode and a cream solder.

FIG. 14 is an enlarged view of the vicinity of a ball electrode 1 obtained during the packaging. A cream solder 3 applied on a wiring electrode (land) 11 of a package substrate 2 is present below the ball electrode 1. If the ball electrode 1 and the cream solder 3 are made of different solders, air contamination is caused in the vicinity of the contact portion therebetween because of the difference in the melting point, and thus voids may be caused. When such voids are caused, the soldering reliability of the ball electrode 1 can be lowered.

The mechanism of the occurrence of the voids derived from the air contamination is shown in FIGS. 15A through 15D. In these drawings, the structure shown in FIG. 14 is simplified.

Figure 15A:
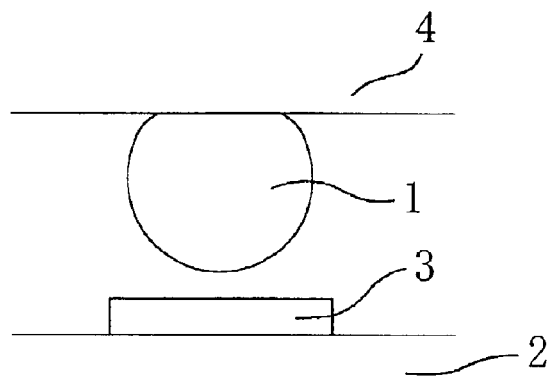
FIGS. 15A, 15B, 15C and 15D are diagrams for explaining the mechanism of formation of voids 32.
Figure 15B:
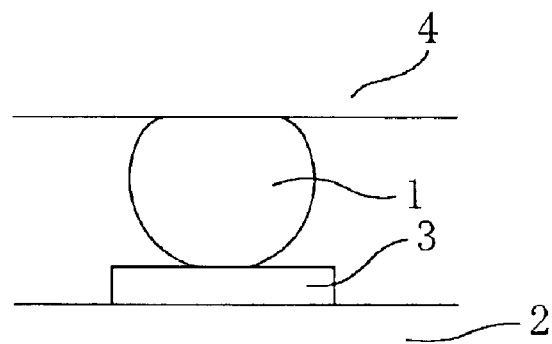
Figure 15C:
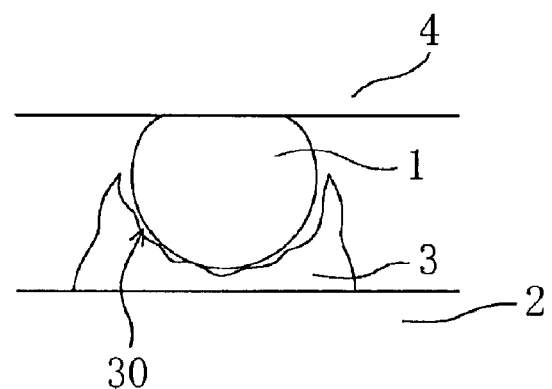
Figure 15D:
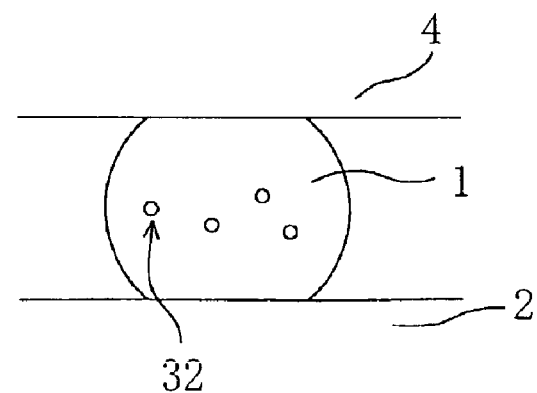

First, from the state shown in FIG. 15A (namely, the state of FIG. 14), the ball electrode 1 is brought to direct contact with the cream solder 3 as shown in FIG. 15B. When they are heated to melt thereafter, since the melting points of the ball electrode 1 and the cream solder 3 are different, the cream solder 3 melted earlier surrounds the ball electrode 1, and at this point, the air 30 is contaminated. Subsequently, the ball electrode 1 is also melted, but unless the air 30 is completely evacuated, voids 32 are formed within the ball electrode 1 when the soldering is completed. These voids 32 can lower the soldering reliability of the ball electrode 1. It seems very difficult to completely evacuate the once contaminated air 30 from a melted solder with high viscosity.

Figure 16A:
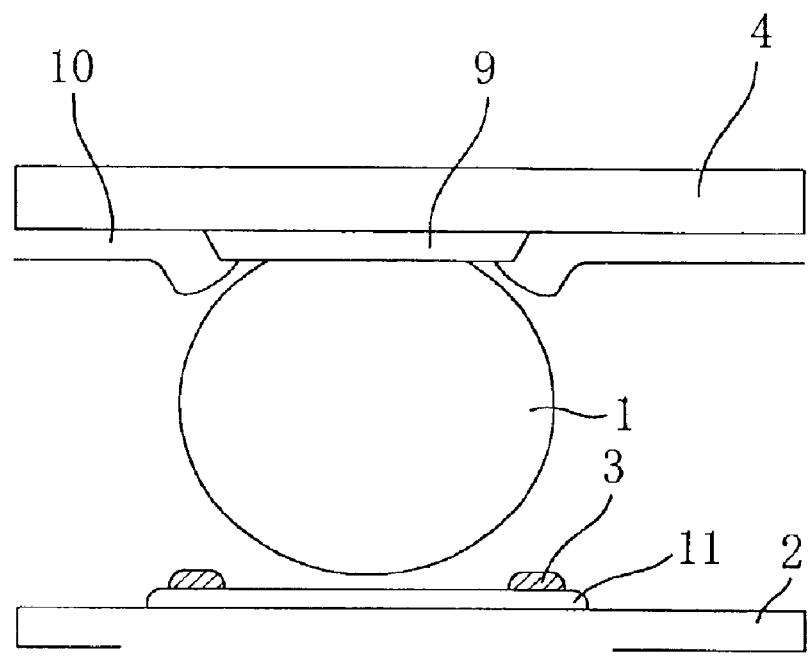
FIG. 16A is a cross-sectional view for schematically showing the structure around the cream solder and FIG. 16B is a plan view for showing the pattern of the cream solder.
Figure 16B:
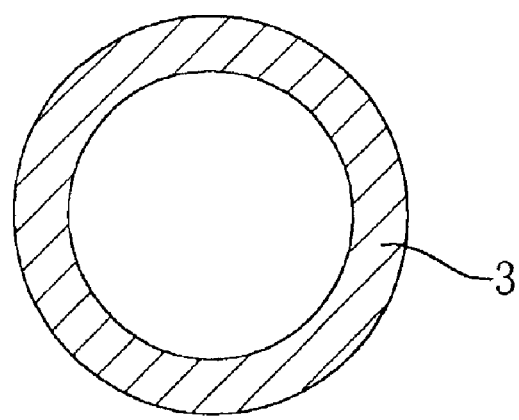

In order to overcome the problem of the voids 32, the cream solder 3 is applied as shown in FIGS. 16A and 16B in this embodiment. Specifically, the cream solder 3 is applied on the land 11 so as not to be in contact with the ball electrode 1 around a portion where the ball electrode 1 is to be placed. FIG. 16A is a cross-sectional view and FIG. 16B is a plan view of the cream solder 3.

After bringing the ball electrode 1 to contact with the land 11, the resultant is allowed to pass through a reflow furnace in a high temperature atmosphere, so that the ball electrode 1 can be melted priorly to or simultaneously with the cream solder 3. Thus, the ball electrode 1 is soldered onto the land 11. Since the ball electrode 1 of this embodiment is made of a low melting point solder, it can be melted priorly to or simultaneously with the cream solder 3.

In this manner, the ball electrode 1 is melted priorly or simultaneously, and hence, the contamination of the air 30 by the cream solder 3 can be reduced, resulting in suppressing or reducing the formation of the voids 32.

Figure 17A:
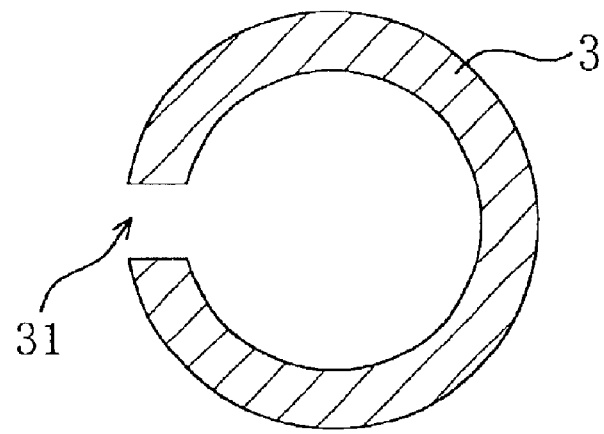
FIGS. 17A and 17B are plan views of other patterns of the cream solder.
Figure 17B:
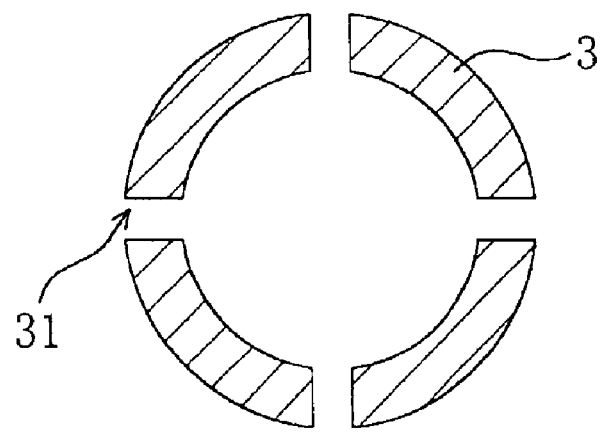

Although the cream solder 3 is applied in a substantially ring pattern (including not only a circular ring but also an elliptical ring or a polygonal ring similar to a circular ring) in FIGS. 16A and 16B, the pattern of applying the cream solder 3 may be modified, for example, as shown in FIGS. 17A and 17B. In FIG. 17A, the cream solder 3 is applied in a pattern with one gap 31, and in FIG. 17B, it is applied in a pattern with four gaps 31. In the case where the cream solder 3 is applied not continuously but in a pattern with one or more gaps 31 as in FIGS. 17A and 17B, the air 30 can be easily released, and hence, the voids can be further reduced.

Figure 18:
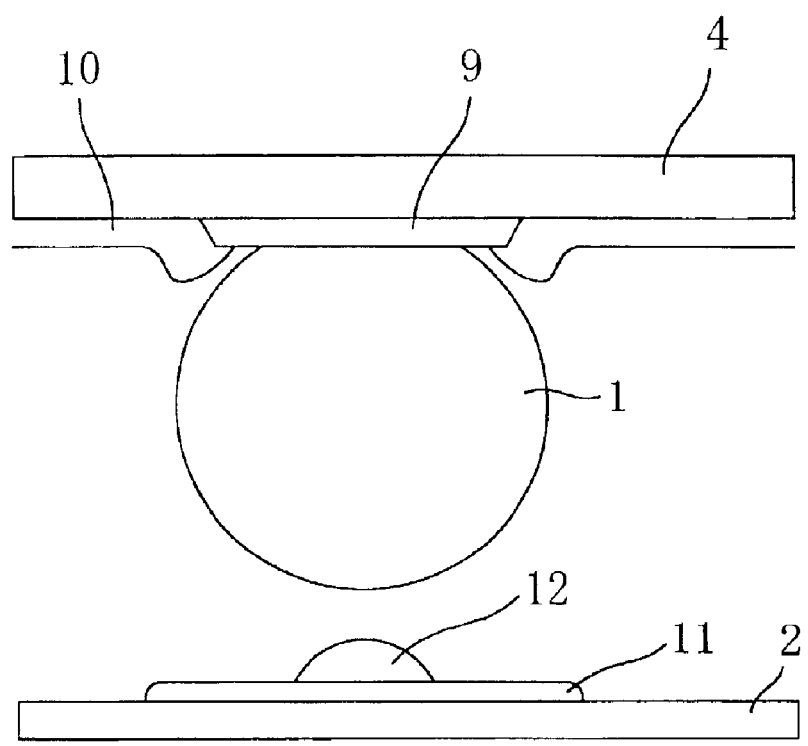
FIG. 18 is an enlarged view of a principal part around a ball electrode and a metal protrusion.

Also, the following packaging method is effective for reducing the voids. Referring to FIG. 18, the other packaging method will be described. In FIG. 18, a metal protrusion 12 is formed on the land 11.

A temperature at which a solder is solidified is determined depending upon its liquidus line. At a temperature higher than the liquidus line, a liquid phase exists. A temperature at which a solder is melted is determined depending upon its solidus line. At a temperature lower than the solidus line, a solid phase exists. There is a region where the liquid phase and the solid phase both exist between the liquidus line and the solidus line. The conventional tin-lead eutectic solder has an eutectic point of 183° C., at which the liquidus line accords with the solidus line.

On the other hand, the liquidus line and the solidus line do not accord with each other in general in most of the lead-free solders. This can be understood from Table 1 above. The liquidus line not according with the solidus line means that there is a liquid-solid coexistence region in the phase diagram of a lead-free solder. The formation of the voids 32 within a solder ball electrode can be suppressed by utilizing the liquid-solid coexistence region.

The solder ball electrode 1 of FIG. 18 has the liquid-solid coexistence region, and hence is in a semi-melted state in which it is softer than a solder in an eutectic state (solid state). Accordingly, the metal protrusion 12 (of, for example, nickel or nickel-gold plating) provided on the land 11 of the package substrate 2 can be thrust into the ball electrode 1. As a result, the ball electrode 1 and the metal protrusion 12 are directly jointed to each other and hence can be soldered without contaminating the air 30. Thus, the formation of the voids 32 can be suppressed.

In this manner, the formation of the voids 32 within the ball electrode 1 of the lead-free solder can be suppressed in this embodiment. Also, since the BGA package 100 including the solder ball electrode 1 that can be melted at a sufficiently low temperature can be provided, it is possible to avoid the thermal damage and the lowering of the soldering reliability derived from the high temperature reflow. Furthermore, the formation of the voids can be suppressed by utilizing the liquid-solid coexistence region of the solder. In addition, when the semiconductor device 100 is mounted on the package substrate 2 with the formation of the voids 32 suppressed, a package with high soldering reliability can be fabricated and provided. The semiconductor device 100 or 200 of this embodiment also has characteristics of a BGA package, namely, advantages such as applicability to surface packaging, multi-pin applicability and downsizing.

Embodiment 3

Embodiment 3 of the invention will now be described with reference to FIGS. 19 through 22. For the sake of simplification, description similar to those of Embodiments 1 and 2 are omitted or simplified.

The present inventors have made experiments on various combinations of a ball electrode (for example, referred to by the reference numeral 1 in FIG. 6) of a BGA package, a solder paste (for example, referred to by the reference numeral 3 in FIG. 6) used for the packaging and surface processing of a copper land (for example, referred to by the reference numeral 11a in FIG. 6) provided on a package substrate, so as to evaluate the congeniality of the combinations.

First, evaluation of the ball shear strength test will be described. The ball shear strength test is performed in the same manner as described in Embodiment 1 referring to FIGS. 11, 12A and 12B. In brief, a solder paste is applied on a copper land of a package substrate, a ball electrode is placed on the solder paste, and then, the solder paste and the ball electrode are soldered through the reflow. Thereafter, the shear strength is measured immediately after the reflow and after allowing the device to stand at a high temperature of 150° C. The purpose of this aging at a high temperature is to rapidly grow an intermetallic compound.

The following seven kinds of ball electrodes are prepared for the ball shear strength test: (1) A Sn—8Zn—3Bi ball; (2) a Sn—3Ag—0.5Cu ball; (3) a Sn—37Pb ball; (4) a Sn—0.2Bi ball; (5) a Sn—2.5Ag—0.5Cu—1Bi ball; (6) a Sn—9Zn ball; and (7) a Sn—9Zn—1In ball. The following three kinds of solder pastes (cream solders) are prepared: A Sn—8Zn—3Bi paste; a Sn—3Ag—0.5Cu paste; and a Sn—37Pb paste. The following two kinds of surface processing are employed for a copper land: Ni/Au plating processing (with the Au layer stacked on the Ni layer); and pre-flux processing.

Figure 19:
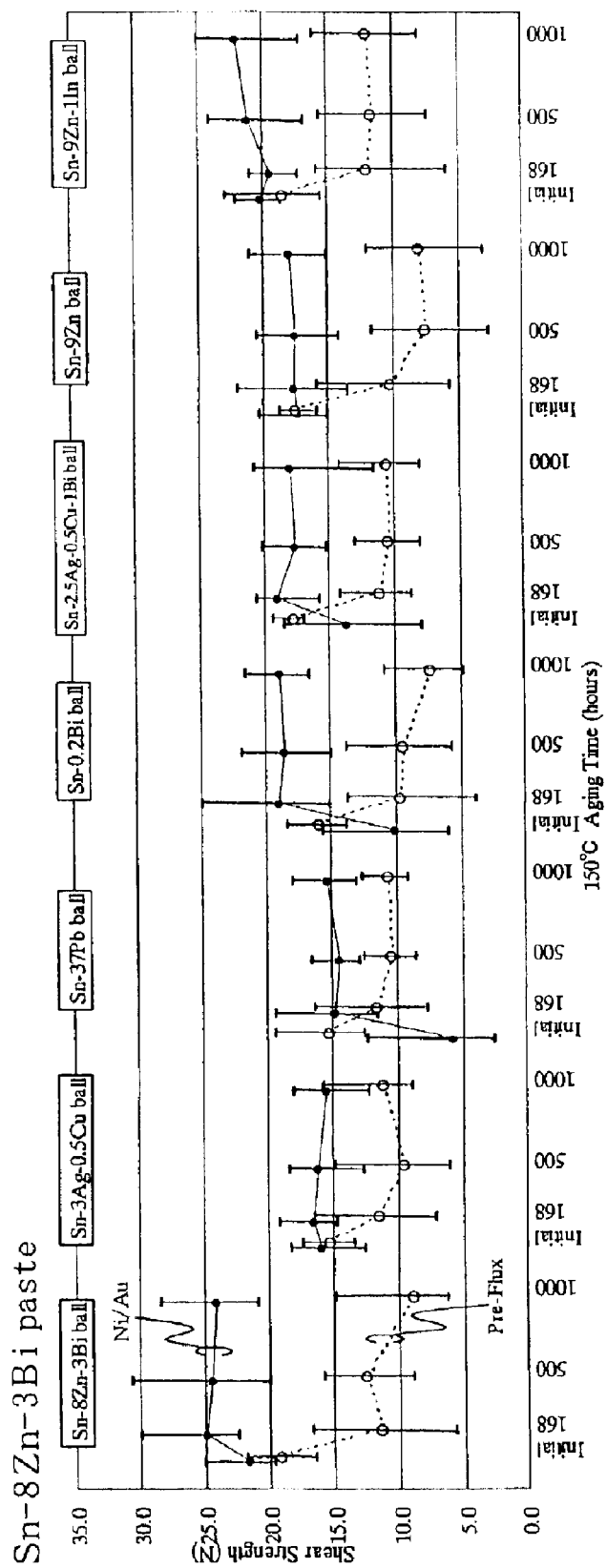
FIG. 19 is a graph for showing the result of a ball shear strength test obtained in using a Sn—8Zn—3Bi paste.
Figure 20:
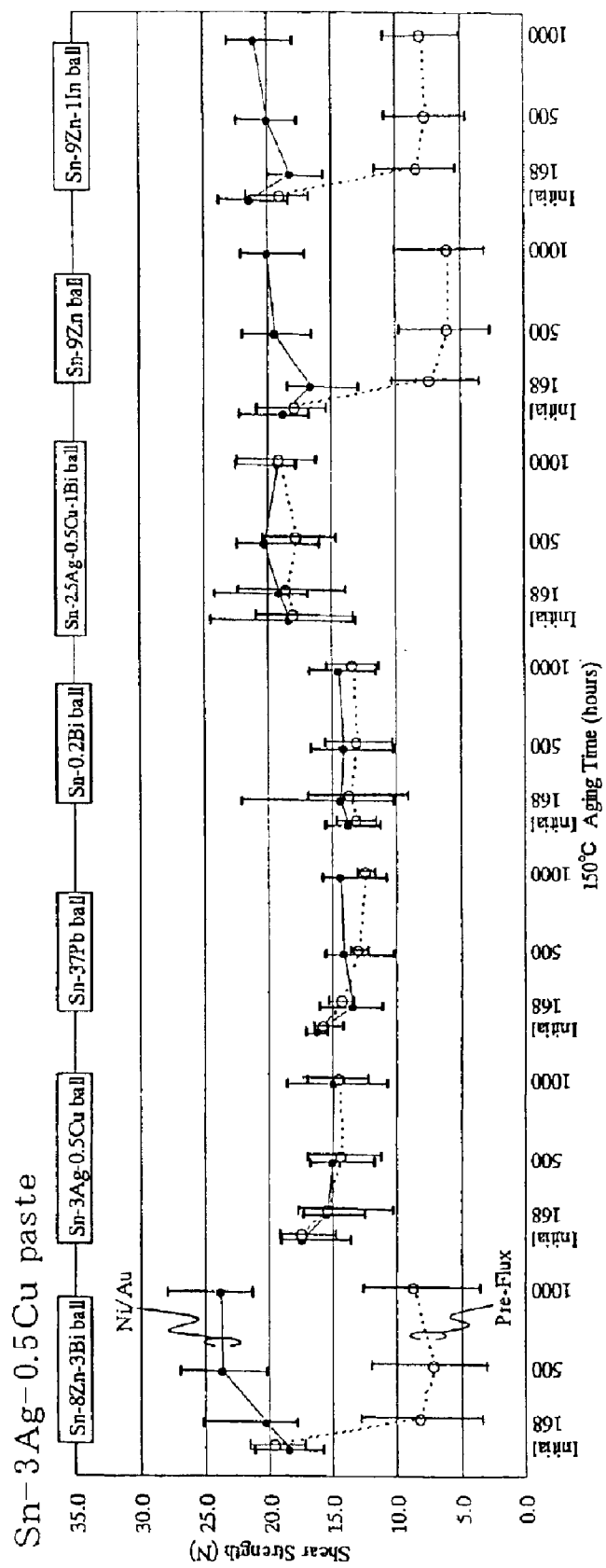
FIG. 20 is a graph for showing the result of a ball shear strength test obtained in using a Sn—3Ag—0.5Cu paste.
Figure 21:
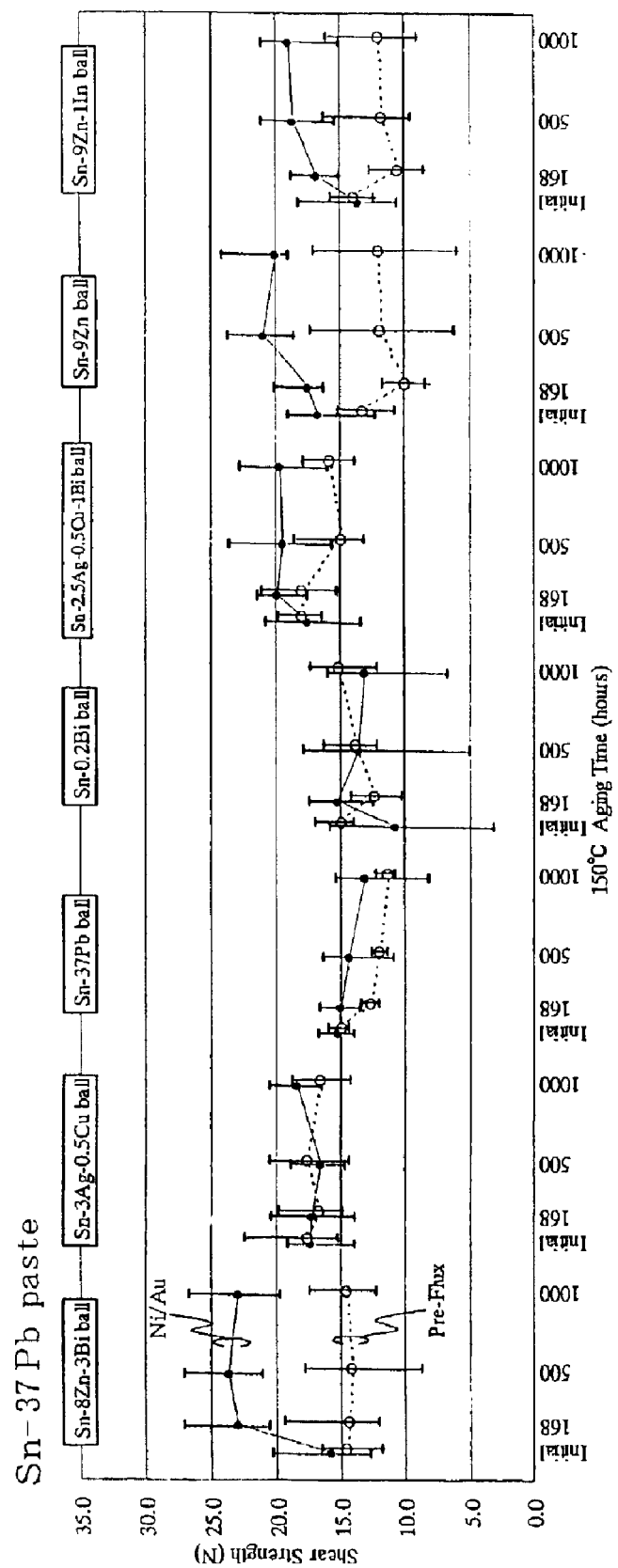
FIG. 21 is a graph for showing the result of a ball shear strength test obtained in using a Sn—37Pb paste.
Figure 22:
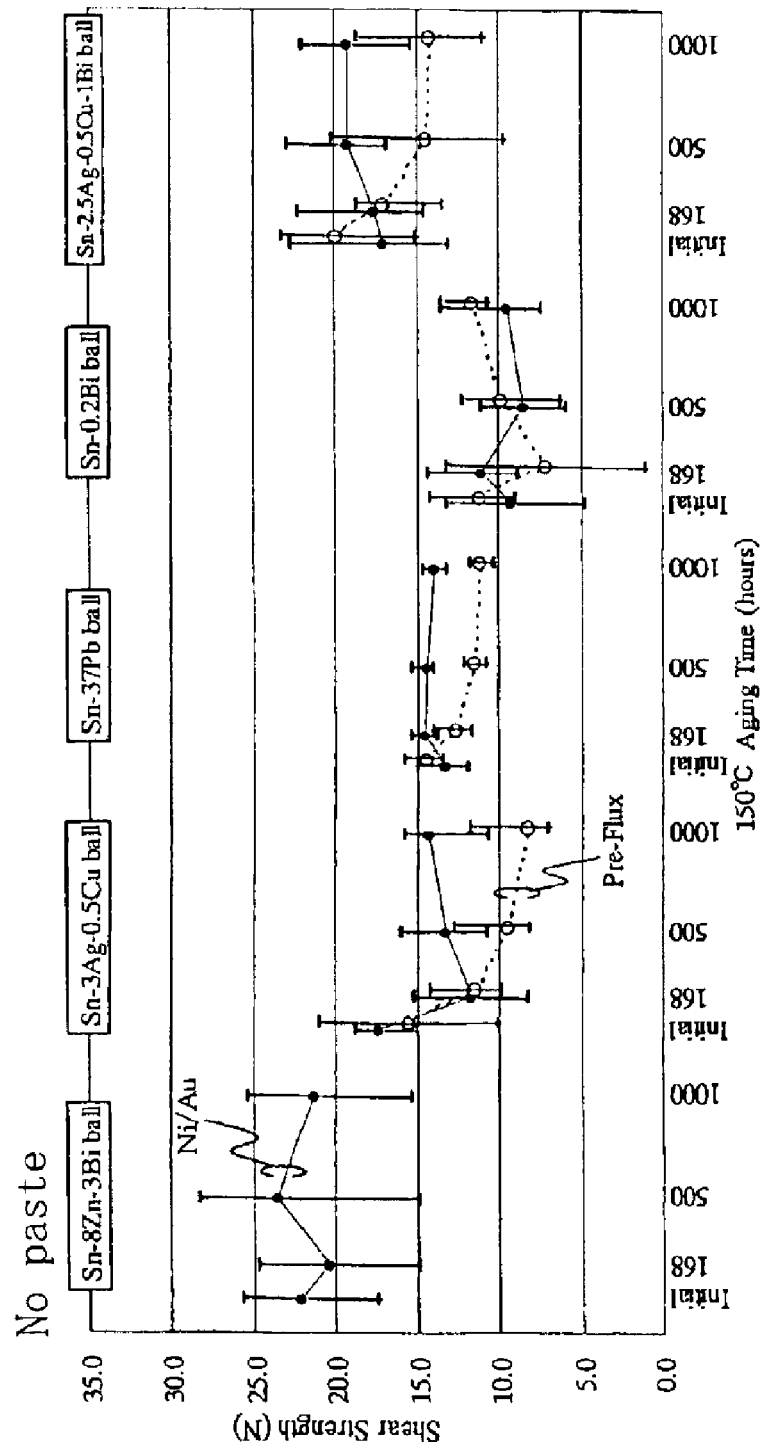
FIG. 22 is a graph for showing the result of a ball shear strength test obtained in reflow joint with a flux alone without using a paste.
Figure 23:
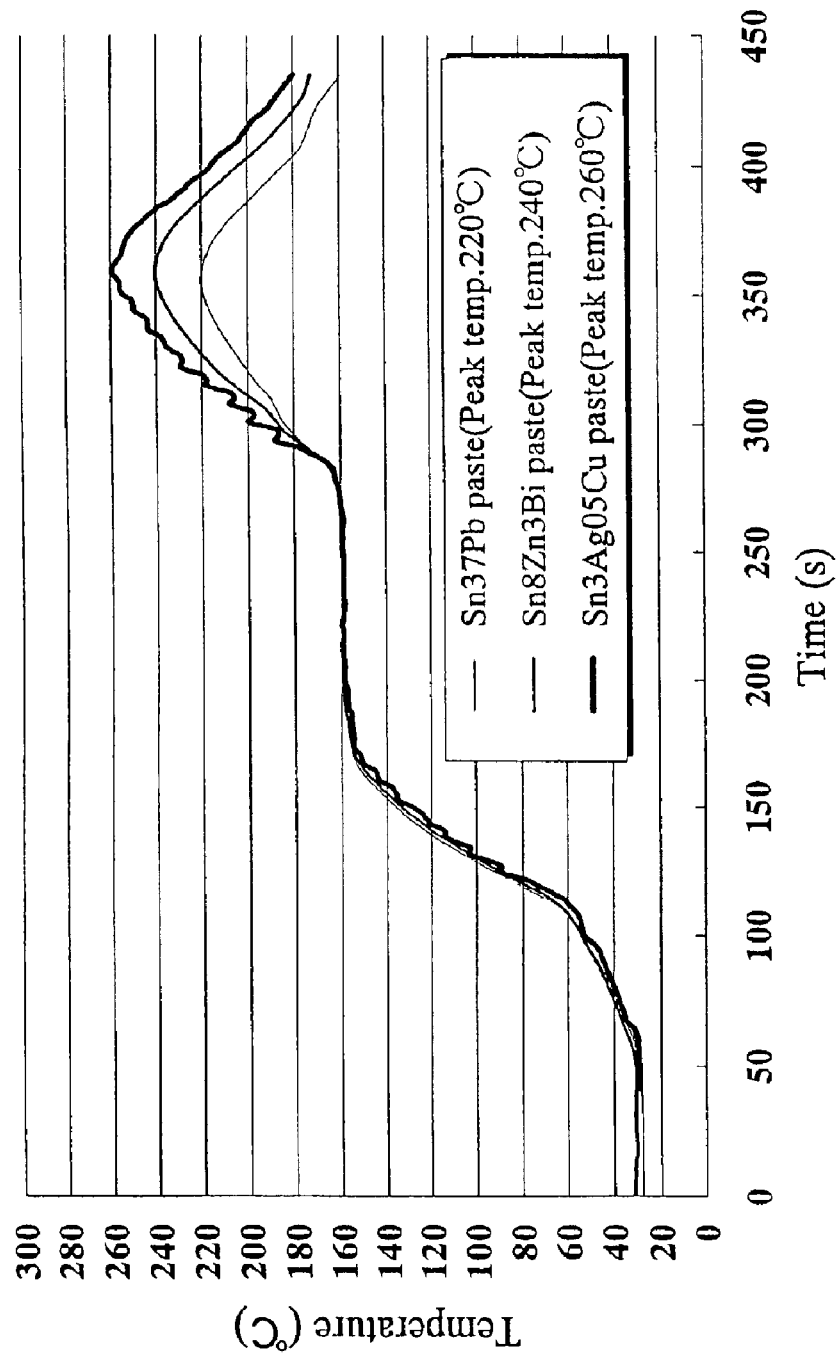
FIG. 23 is a graph of a profile of reflow.

The results of the ball shear strength test are shown in FIGS. 19 through 22. FIGS. 19 through 21 show the results obtained in using the Sn—8Zn—3Bi paste, the Sn—3Ag—0.5Cu paste and the Sn—37Pb paste, respectively, and graphs respectively obtained by using the seven kinds of ball electrodes and employing the two kinds of surface processing are shown in each drawing. FIG. 22 shows, as a reference, the result obtained in reflow joint by employing the flux alone without using a paste. In each of FIGS. 19 through 22, the ordinate indicates the shear strength (N) and the abscissa is a time axis indicating the initial stage of, 168 hours after, 500 hours after and 1000 hours after the reflow joint. FIG. 23 shows a profile of the reflow. The conditions for the reflow are set in accordance with the melting point of each solder paste.

As shown in FIG. 19, in using the Sn—8Zn—3Bi solder paste, the strength of the Ni/Au plated land is increased but the strength of the pre-fluxed land is lowered through the aging at a high temperature. In particular, in the combination of the Sn—Zn-based solders (namely, in the combination of the Sn—Zn-based ball electrode and the Sn—Zn-based solder paste), this tendency is remarkably exhibited. As shown in FIGS. 20 and 21, in the case where the ball electrode is made of the Sn—Zn-based solder, the same results are obtained in using the Sn—3Ag—0.5Cu paste and the Sn—37Pb paste.

Based on these results, it can be concluded that the strength is improved through the Ni/Au plating but lowered through the pre-flux processing when Zn is included at least either the ball electrode or the solder paste (namely, when at least one of them is made of the Sn—Zn-based solder).

Accordingly, in the case where at least one of the ball electrode and the solder paste is made of the Sn—Zn-based solder, the Ni/Au plating is preferably performed as the surface processing of the land. Specifically, in the structure shown in FIG. 6, the lands (9a and 11a) are preferably provided with the Ni/Au plating (9b and 11b). In the case where neither the ball electrode nor the solder paste is made of the Sn—Zn-based solder, no difference is caused by the surface processing of the land.

Figure 24:
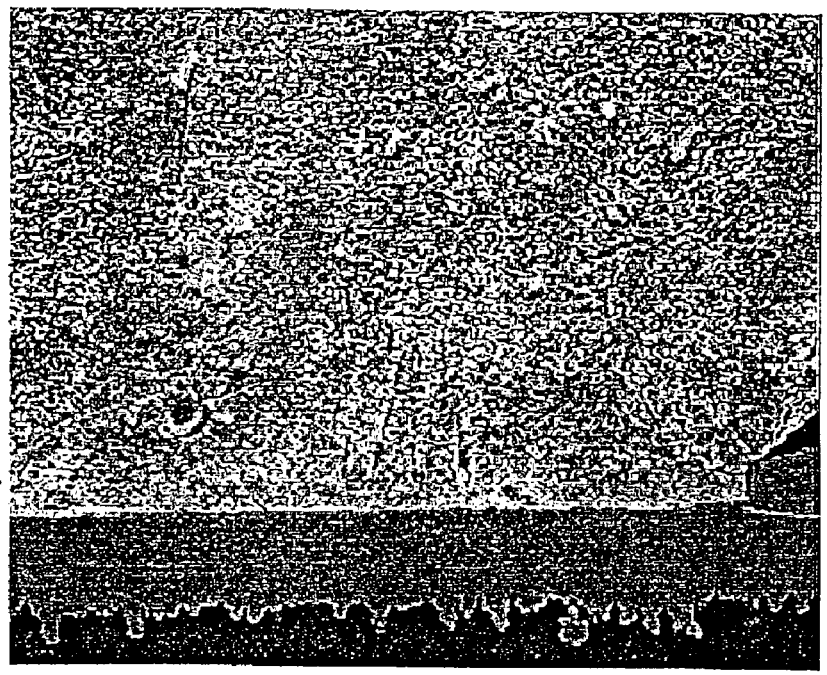
FIG. 24 is a drawing substitute for showing an SEM image of a joint portion of a sample having Ni/Au plating.
Figure 25:
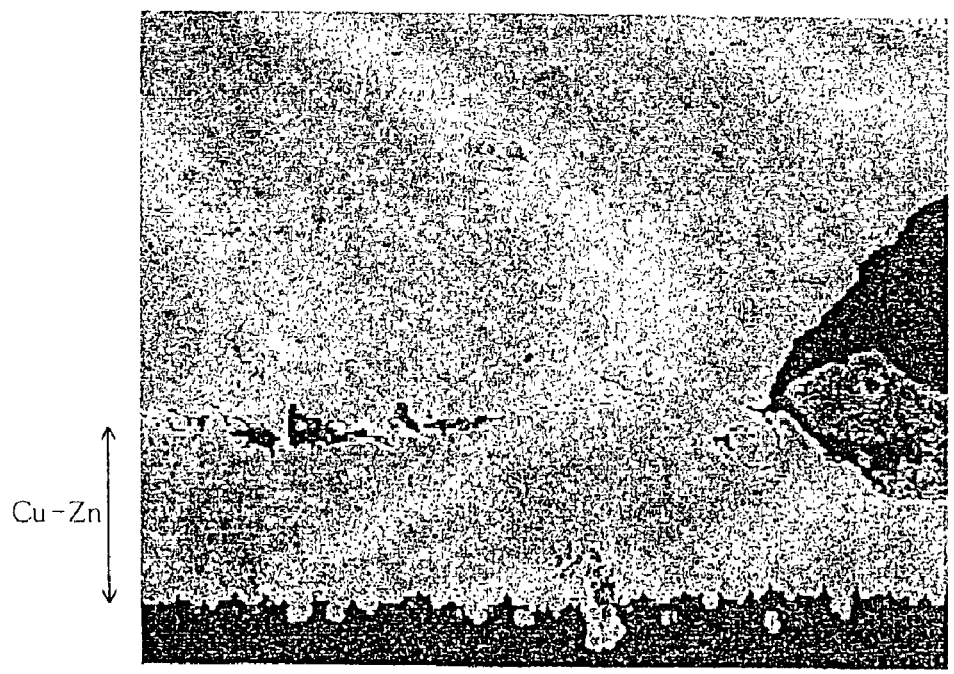
FIG. 25 is a drawing substitute for showing an SEM image of a joint portion of a sample having been pre-fluxed.

Next, SEM (cross-sectional) images of the soldered portions of the samples are shown in FIGS. 24 and 25. FIGS. 24 and 25 show the soldered portions of the Sn—Zn-based ball electrodes with the copper lands having been subjected to the Ni/Au plating and the pre-flux processing, respectively.

As shown in FIG. 24, in employing the Ni/Au plating, the copper land is protected by the Ni/Au plating. It is confirmed through an elemental analysis that Zn is deposited on the Ni plating in employing the Ni/Au plating. The Au included in the Ni/Au plating seems to have been diffused into the ball electrode. On the other hand, as shown in FIG. 25, in employing the pre-flux processing, the copper land is corroded by zinc (Zn) and a portion where the copper land has existed is changed into a comparatively friable Cu—Zn alloy layer. In other words, a Cu—Zn alloy layer is largely grown from the copper land having been subjected to the pre-flux processing (namely, the land having copper exposed without having the Ni/Au plating) and the Zn component of the ball electrode. As is understood from FIG. 25, the Cn—Zn alloy layer and the ball electrode are not well adhered to each other and there is a gap therebetween. Since such a problem is not caused in using a solder including lead, this problem may be peculiar to a lead-free solder. Also, the Cn—Zn alloy layer is largely grown in FIG. 25 probably because the growth rate is accelerated by the aging at a high temperature of 150° C.

Accordingly, in the combination where either the ball electrode or the solder paste includes Zn, the pre-flux processing lowers the soldering strength due to the large growth of the Cn—Zn alloy layer. In reverse, when the land is subjected to the Ni/Au plating in this combination, the soldering strength seems to be improved because the Zn component is deposited on the Ni plating.

The thickness of the Au plating in employing the Ni/Au plating is preferably within a given range. Specifically, in the structure shown in FIG. 6, the thickness of the Au plating in the Ni/Au plating 11b formed on the land (conducting wire) 11a of the package substrate 2 and the thickness of the Au plating in the Ni/Au plating 9b formed on the land (rear electrode) 9a of the BGA package are preferably more than 0 and less than 0.5 μm. Since the Au is used merely for preventing oxidation of the Ni, the thickness of gold flash (of, for example, 0.003 μm) is sufficient. From a viewpoint of comparatively easy film formation in the fabrication process, the thickness may be 0.03 μm or more. It is found through an experiment that when the thickness of the Au plating exceeds approximately 0.5 μm, the strength may be lowered because an Au—Zn layer generated from the Zn of the solder and the Au of the plating can be formed. Accordingly, the thickness of the Au plating is preferably less than 0.6 μm, or 0.5 μm or less, and in order to further eliminate factors of the lowering of the strength, it is preferably 0.3 μm or less and more preferably 0.03 μm or less. It seems that the influence of the Au—Zn layer can be minimized by appropriately selecting the conditions even when the thickness of the Au plating is, for example, approximately 1 μm. The thickness of the Ni plating can be appropriately set in accordance with the fabrication conditions and employed standards since this thickness does not particularly affect the soldering. For example, the thickness of the Ni plating may be 3 through 5 μm and is typically approximately 5 μm.

Figure 26:
FIG. 26 is a drawing substitute for showing an SEM image of a ball electrode.
Figure 27:
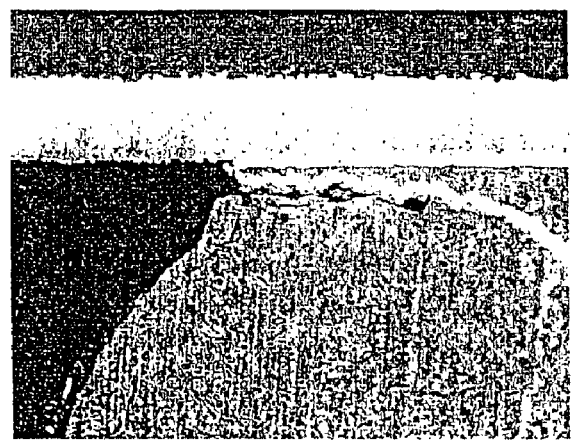
FIG. 27 is a drawing substitute for showing a partly enlarged image of FIG. 26.
Figure 28:
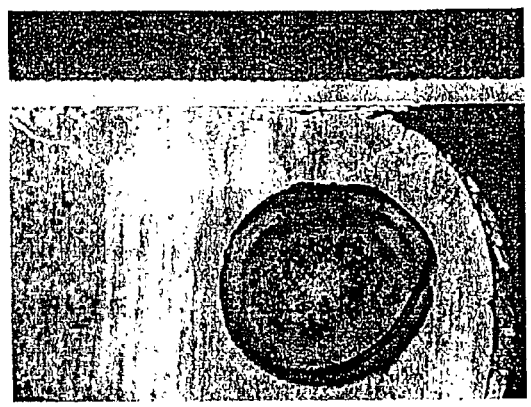
FIG. 28 is a drawing substitute for showing an SEM image of a ball electrode.
Figure 29:
FIG. 29 is a drawing substitute for showing a partly enlarged image of FIG. 28.

FIGS. 26 through 29 are SEM (cross-sectional) photographs of ball electrodes in each of which the Au—Zn layer is found to be present. FIG. 27 is an enlarged view of FIG. 26, and FIG. 29 is an enlarged view of FIG. 28. In these drawings, examples of the Au—Zn layer formed when the thickness of the Au plating exceeds approximately 0.5 μm are shown. It is found through the elemental analysis that a line-like portion present between the copper land and the ball electrode is the Au—Zn layer. Also, there is substantially no Sn component in this line-like portion. It is noted that voids formed in the ball electrodes can be observed in FIGS. 26 and 28.

Next, the evaluation of a test for resistance to thermal fatigue will be described. The present inventors have performed the test for resistance to thermal fatigue by a vapor phase heat cycle test after packaging a BGA package on a package substrate through the reflow, so as to evaluate the heat resistance of various combinations of ball electrodes and solder pastes. In the vapor phase heat cycle test, 15 minutes at −40° C. and another 15 minutes at +125° C., namely, 30 minutes in total, is set as one cycle, and the number of cycles before breaking is counted with the joint resistance always monitored.

The specifications of the BGA package used in the test are as follows: The BGA package is a daisy-chain sample of a plastic ball grid array (PBGA) type. The package has a size of 31 mm and 441 pins with a ball pitch of 1.27 mm. The diameter of a Cu land is 0.635 mm and the diameter of the ball is 0.76 mm. The surface processing of the land is the Ni/Au plating. The reflow is performed in accordance with the profile shown in FIG. 23. The results of this test for resistance to thermal fatigue are listed in Table 2 below.

TABLE 2

| | Solder balls | | | | | | | | | | | | | | |
|---|---|---|---|---|---|---|---|---|---|---|---|---|---|---|---|
| | Sn—8Zn—3Bi | | | | | Sn—3Ag—0.5Cu | | | | | Sn—37Pb | | | | |
| Solder paste | | | | | | | | | | | | | | | |
| Sn—8Zn—3Bi | 1952 | — | — | — | — | 1758 | 1379 | — | 1491 | — | 1544 | 1530 | 1351 | 1354 | 1302 |
| | — | — | — | — | — | 1793 | 1875 | 1725 | 1575 | | 1333 | 1414 | 1192 | 1145 | |
| Sn—3Ag—0.5Cu | 1628 | 1529 | 1568 | 1565 | 1699 | — | — | — | — | 1935 | 1134 | 1329 | 1347 | 1151 | 1242 |
| | 1779 | 1834 | 1744 | 1662 | | — | — | — | — | | 1393 | 1113 | 1389 | 1573 | |
| Sn—37Pb | 1492 | — | 1818 | 1739 | — | — | — | — | — | — | 1593 | 1493 | 1578 | 1573 | 1493 |
| | — | 1949 | 1845 | 1899 | | — | — | — | — | | 1367 | 1436 | 1799 | 1540 | |

The used ball electrodes are a Sn—8Zn—3Bi (Sn—Zn-based) ball electrode, a Sn—3Ag—0.5Cu (Sn—Ag—Cu-based) ball electrode and a Sn—37Pb ball electrode (including Pb), and the used solder pastes are the same three kinds. The number (N) of samples of the BGA package used for each combination is 9, and each numerical value listed in the table corresponds to a cycle number in which failure occurs, and "–" indicates that failure does not occur during 2000 cycles or more.

It is understood from Table 2 that the Sn—Zn-based solder paste is most suitably used when the Sn—Zn-based ball electrode is used. In comparison with this, the congeniality between the Sn—Zn-based ball electrode and the Sn—3Ag—0.5Cu solder paste or the Sn—37Pb solder paste is not good. On the other hand, with respect to the Sn—3Ag—0.5Cu ball electrode, the congeniality with the Sn—3Ag—0.5Cu solder paste or the Sn—37Pb solder paste is good but the congeniality with the Sn—Zn-based solder paste is poor.

This reveals that there is suitable congeniality between a ball electrode and a solder paste, and hence it is understood that the congeniality found about the Sn—Ag—Cu-based ball electrode cannot be directly applied to the Sn—Zn-based ball electrode even though they are both the lead-free solders. In the above-described samples, the Sn—Ag—Cu-based ball electrode has good congeniality not only with the Sn—Ag—Cu-based solder paste of the same type but also with the Sn—Pb-based solder paste, but the Sn—Zn-based ball electrode has particularly good congeniality with the Sn—Zn-based solder paste of the same type. In other words, when a Sn—Zn-based ball electrode is used, the resistance characteristic to thermal fatigue can be improved by using a solder paste having the same composition (namely, by combining the Sn—Zn-based solders).

Figure 30:
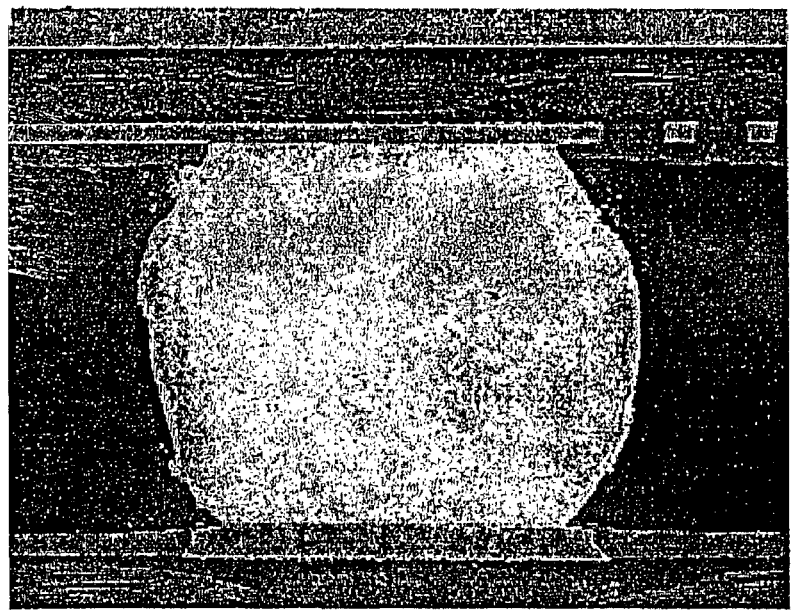
FIG. 30 is a drawing substitute for showing an SEM image of a semi-melted state of a solder ball obtained in a combination of Sn—Zn based solders.
Figure 31:
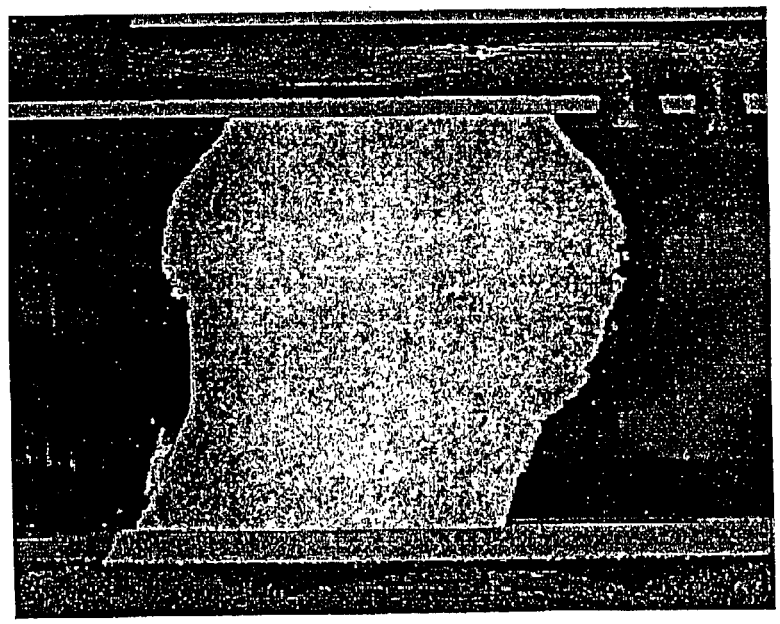
FIG. 31 is a drawing substitute for showing an SEM image of a semi-melted state of a solder ball obtained in a combination of a Sn—Ag—Cu-based solder and a Sn—Zn-based solder.
Figure 32:
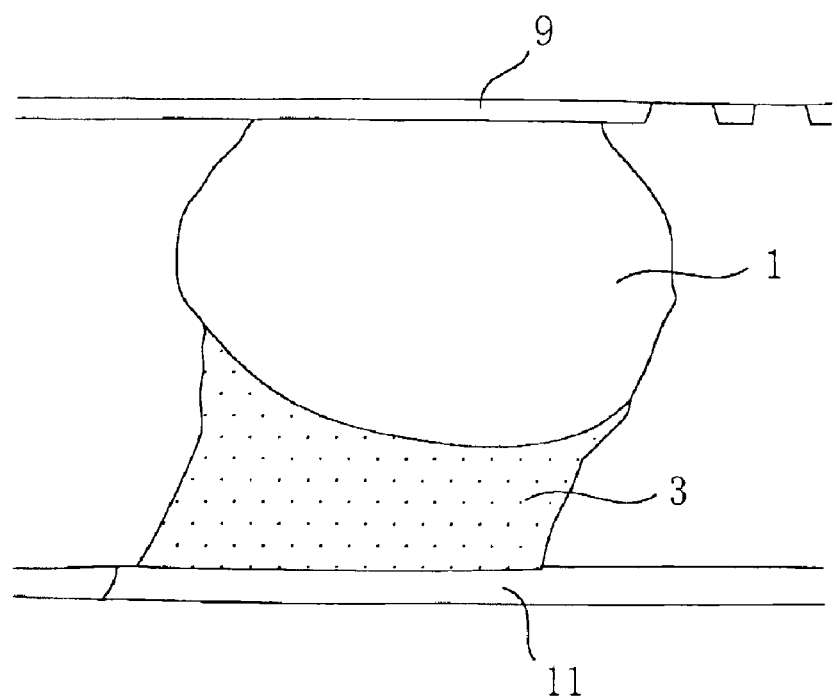
FIG. 32 is a trace diagram of FIG. 31.

FIGS. 30 and 31 show SEM (cross-sectional) photographs of solder balls in a melted state. FIG. 30 shows a combination of a Sn—Zn-based ball electrode (specifically, a Sn—8Zn—3Bi ball) and a Sn—Zn-based solder paste (specifically, a Sn—8Zn—3Bi paste), and FIG. 31 shows a combination of a Sn—Ag—Cu-based ball electrode (specifically, a Sn—3Ag—0.5Cu ball) and a Sn—Zn-based solder paste (specifically, a Sn—8Zn—3Bi paste). FIG. 32 is a trace diagram of FIG. 31, in which a reference numeral 1 denotes a ball electrode, a reference numeral 3 denotes a solder paste (cream solder) and reference numerals 9 and 11 denote lands.

As shown in FIG. 30, in the combination of the Sn—Zn-based solders, the ball electrode and the solder paste are completely melted to be mixed so as to attain a satisfactory melted state. On the other hand, in the combination of the Sn—Ag—Cu-based solder and the Sn—Zn-based solder, namely, in the case where the melting point of the solder paste is lower than that of the ball electrode, the ball electrode is not melted but they are jointed through melting of the solder paste alone. FIG. 32 shows this state more comprehensively. In the combination of the Sn—Ag—Cu-based solder and the Sn—Zn-based solder, such soldering through the melting of the solder paste alone can occur, and this is presumed to lead to the results shown in Table 2.

The conditions for the reflow packaging of a BGA package on a package substrate are generally determined conveniently for the packaging side to which the BGA package is supplied. In other words, the conditions are generally determined in accordance with the melting point of the solder paste (cream solder) of the package substrate rather than in accordance with the melting point of the ball electrode of the BGA package. Therefore, even when non-defective BGA package is supplied, if an assembly is fabricated in the state as shown in FIGS. 31 and 32, the resultant assembly may be defective. Since a package maker desires to perform low melting point reflow in consideration of damage on devices, there is sufficient possibility that a Sn—Zn-based solder paste with a low melting point is used even for a BGA package including a ball electrode of a Sn—Ag—Cu-based solder comparatively frequently used among the lead-free solders. In particular, some packages can be heated up to merely 220° C. as typically in a CPU for a personal computer, and therefore, if the BGA package is applied to a CPU, the packaging maker is presumed to use a Sn—Zn-based solder paste with a low melting point, and the reflow profile may be set not in accordance with the melting point (approximately 220° C.) of the Sn—Ag—Cu-based solder but in accordance with the melting point (approximately 197° C.) of the Sn—Zn-based solder paste. In such a case, the phenomenon shown in FIGS. 31 and 32 seems to occur.

In order to avoid the occurrence of this phenomenon so as to more completely melt and mix the ball electrode of the BGA package and the solder paste of the package substrate in the assembly, it is more preferred to use the Sn—Zn-based solder for both the ball electrode and the solder paste than use the Sn—Zn-based solder for merely one of them. In other words, it is preferred that a ball electrode not made of the Sn—Ag—Cu-based solder, which is used comparatively frequently, but made of the Sn—Zn-based solder so that both the ball electrode and the solder paste can be made of the Sn—Zn-based solder. A melted solder ball used in an assembly having the combination of the Sn—Zn-based solders for the both of the ball and the paste is made of a Sn—Zn-based lead-free solder. More specifically, the melted solder ball includes at least tin and zinc and substantially none of lead, silver and copper. To include substantially none of lead, silver and copper means not to include these elements in a range exceeding an impurity level, and herein means to include, for example, 500 ppm (mass ppm) or less of these elements. As described above, the Sn—Zn-based lead-free solder may include, in addition to tin and zinc, either or both of bismuth and indium.

Figure 33A:
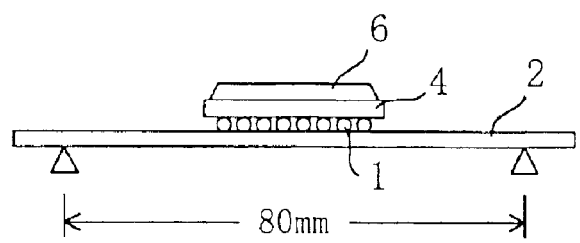
FIGS. 33A and 33B are diagrams for explaining a method for performing a mechanical bending resistance test.
Figure 33B:
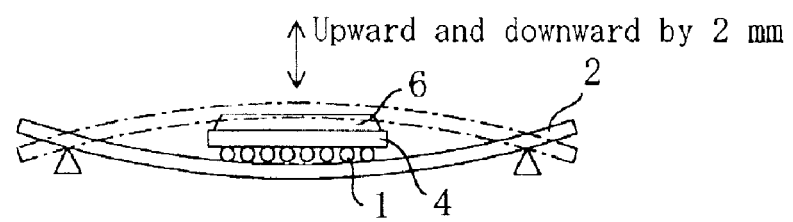

Next, evaluation of a mechanical bending resistance test will be described. As the mechanical bending resistance test, repeated stress applied in pushing a key of portable equipment has been simulated. Specifically, after the reflow packaging of a BOA package on a package substrate, bending stress with a span of 80 mm to an extent of 2 mm was applied as shown in FIGS. 33A and 33B, so as to determine, as the life time, the number of cycles repeated until the solder resistance was varied from the initial value by ±10% or more. The results are listed in Table 3 below. The combinations of the ball electrodes and the solder pastes are the same as those listed in Table 2.

TABLE 3

| | Solder balls | | |
| --- | --- | --- | --- |
| Solder paste | Sn—8Zn—3Bi | Sn—3Ag—0.5Cu | Sn—37Pb |
| Sn—8Zn—3Bi | ⊙ | ◯ | ⊙ |
| Sn—3Ag—0.5Cu | ⊙ | ◯ | x |
| Sn—37Pb | ◯ | ◯ | ◯ |

Marks "⊙", "◯" and "x" used in Table 3 respectively mean that the average life times are longer than, equivalent to and shorter than the current standard (namely, the life time of the combination of the Sn—37Pb ball electrode and the Sn—37Pb solder paste). Specific numbers of reciprocating bending (average numbers of bending before the life time expires) are as follows:

(1) In the case of Sn—8Zn—3Bi ball electrode:
Sn—8Zn—3Bi paste: 500 or more (⊚)
Sn—3Ag—0.5Cu paste: approximately 400 (◎)
Sn—37Pb paste: approximately 250 (○)
(2) In the case of Sn—3Ag—0.5Cu ball electrode:
Sn—8Zn—3Bi paste: approximately 300 (○)
Sn—3Ag—0.5Cu paste: approximately 260 (○)
Sn—37Pb paste: approximately 300 (○)
(3) In the case of Sn—37Pb ball electrode:
Sn—8Zn—3Bi paste: approximately 350 (◎)
Sn—3Ag—0.5Cu paste: approximately200 (×)
Sn—37Pb paste: approximately 250 (○)

As is understood from the results shown in Table 3, it is found that the combination of the Sn—Zn-based solders used for the both of the ball and the paste is better than any other combination. This seems to be caused because the ball electrode and the solder paste are completely melted to be mixed in the combination of the Sn—Zn-based solders so as to be a satisfactorily melted solder ball as shown in FIG. 30.

Next, five kinds of ball electrodes are soldered through the reflow packaging on wiring electrodes (rear electrodes) of BGA packages and the surfaces of the respective ball electrodes are observed. The results are shown in FIGS. 34A through 38C. FIGS. 34A through 34C, 35A through 35C, 36A through 36C, 37A through 37C and 38A through 38C are SEM images for showing the appearances of a Sn—8Zn—3Bi ball electrode, a Sn—9Zn ball electrode, a Sn—9Zn—1In ball electrode, a Sn—3Ag—0.5Cu ball electrode and a Sn—37Pb ball electrode, respectively. Among these drawings, those referred to as A, B and C are images of 35, 100 and 500 magnifications, respectively. The peak temperature of the reflow is set to a temperature +30° C. above the melting point of the solder ball. With reflect to the lead-free ball electrodes (namely those shown in FIGS. 34A through 37C), RMA376EBLV flux of alpha-metals is used, and with respect to the Sn—Pb eutectic ball electrode (namely, that shown in FIGS. 38A through 38C), 529D-1 flux of Senju Metals Co., Ltd. is used. The appearance of each of these drawings accords with the tendency obtained over 100 BGA packages each having 441 ball electrodes (namely, 44100 ball electrodes in total).

As shown in FIGS. 37A through 37C and 38A through 38C, the Sn—37Pb ball electrode and the Sn—3Ag—0.5Cu ball electrode had comparatively fine texture and were in a substantially spherical shape as a whole. On the other hand, as shown in FIGS. 34A through 36C, all of the Sn—Zn-based ball electrodes having a low melting point had irregularities on the surfaces. Among the Sn—Zn-based ball electrodes, the Sn—9Zn ball electrode had particularly large recesses (as shown in FIGS. 35A through 35C). Actually, an error occurred in identifying the position of the ball due to these recesses in a laser irradiation test. With respect to the Sn—8Zn—3Bi ball electrode (shown in FIGS. 34A through 34C) and the Sn—9Zn—1In ball electrodes (shown in FIGS. 36A through 36C), such large recesses as those of the Sn—9Zn ball electrode were not formed. Accordingly, these balls can be identified through the laser irradiation. Therefore, from the viewpoint of the appearance, a ball electrode having the Sn—9Zn composition and including Bi or In (or both) seems more effective than a ball electrode composed of Sn and Zn alone (as in the Sn—9Zn composition).

The recesses may have been reduced by adding Bi or In to the Sn—9Zn composition because the eutectic point is shifted by this addition, and hence the ball can be formed into a shape closer to a spherical shape with reducing the recesses. Also, the recesses may be reduced by changing the reflow profile. Even when an error occurs in the identification of a ball through the laser irradiation, the position of the ball can be identified by image processing or a visual method if necessary, and therefore, such another method can be employed for the identification.

The appearances of the ball electrodes shown in FIGS. 34A through 38C will be described in more detail.

Figure 34A:
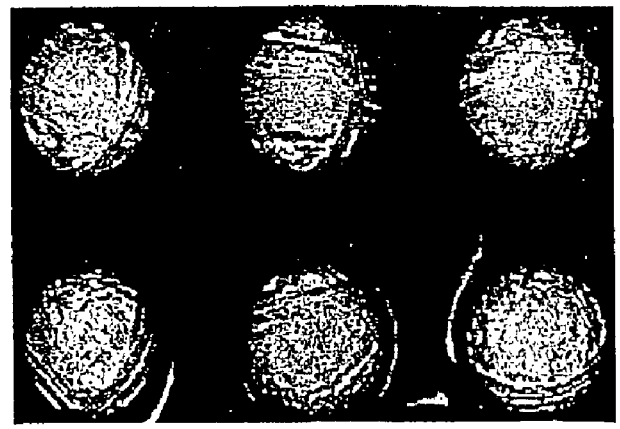
FIGS. 34A, 34B and 34C are drawing substitutes for showing SEM images of the appearance of a Sn—8Zn—3Bi ball electrode.
Figure 34B:
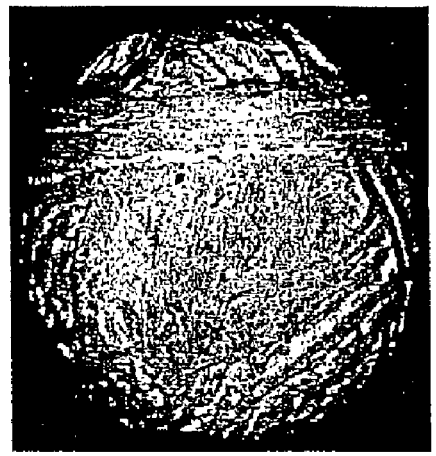
Figure 34C:
Figure 35A:
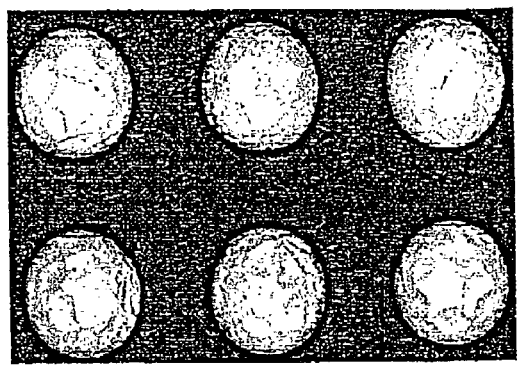
FIGS. 35A, 35B and 35C are drawing substitutes for showing SEM images of the appearance of a Sn—9Zn ball electrode.
Figure 35B:
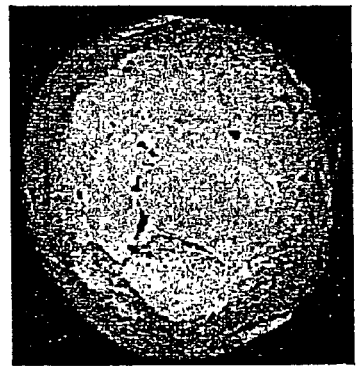
Figure 35C:

The Sn—8Zn—3Bi ball electrode shown in FIGS. 34A through 34C have the largest number of wrinkles among the five kinds of ball electrodes, and this ball is found to have lines like a ball of knitting yarn in FIG. 34C. These lines may be portions corresponding to the Zn component. This ball is in a substantially spherical shape and hence its position can be identified through the laser irradiation. Also, a hole that may be a shrinkage cavity is found. A "shrinkage cavity" is something like needle crystal formed from the surface of a solder toward the inside thereof.

The Sn—9Zn ball electrode shown in FIGS. 35A through 35C have large recesses, and hence, an error occurs in identifying its position through the laser irradiation. Although this ball is of the Sn—Zn-based, no lines as those of FIGS. 34A through 34C are observed. Also, a hole that may be a shrinkage cavity is found.

Figure 36A:
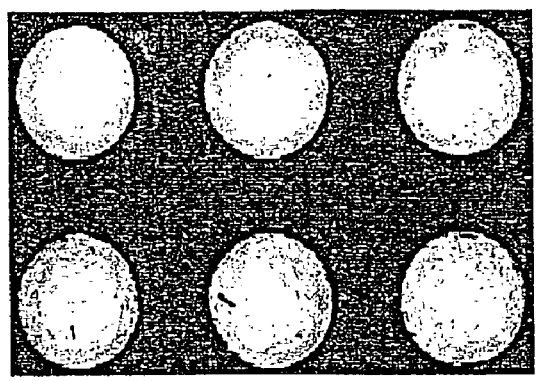
FIGS. 36A, 36B and 36C are drawing substitutes for showing SEM images of the appearance of a Sn—9Zn—1In ball electrode.
Figure 36B:
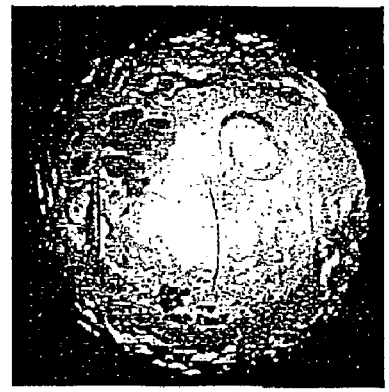
Figure 36C:

The Sn—9Zn—1In ball electrode shown in FIGS. 36A through 36C has small recesses but is in a shape close to a sphere as a whole, and hence its position can be identified through the laser irradiation.

Figure 37A:
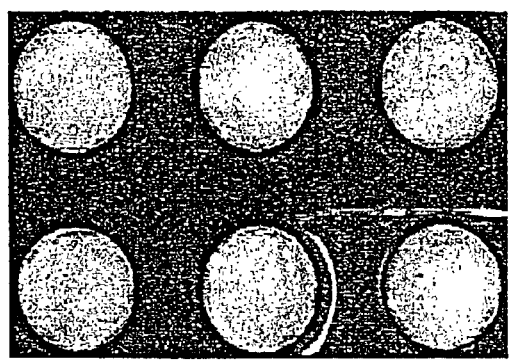
FIGS. 37A, 37B and 37C are drawing substitutes for showing SEM images of the appearance of a Sn—3Ag—0.5Cu ball electrode.
Figure 37B:
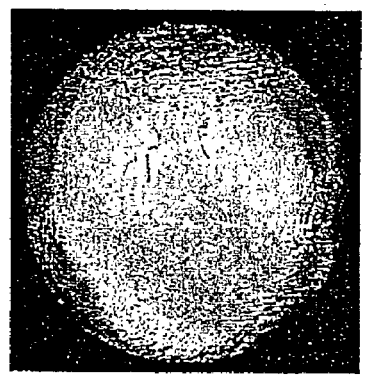
Figure 37C:

The Sn—3Ag—0.5Cu ball electrode shown in FIGS. 37A through 37C has fine texture as a whole and is in a shape close to a sphere, and hence its position can be identified through the laser irradiation. No lines as those found in FIGS. 34A through 34C is found. Also, a hole that may be a shrinkage cavity is found.

Figure 38A:
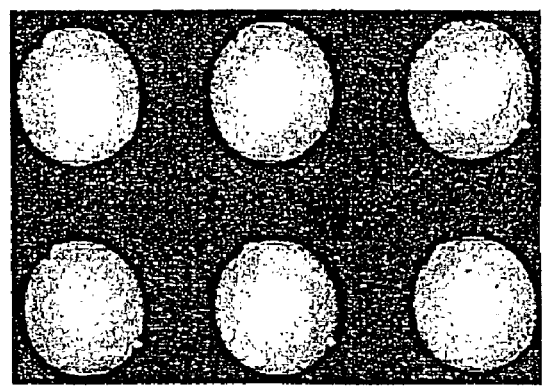
FIGS. 38A, 38B and 38C are drawing substitutes for showing SEM images of the appearance of a Sn—37Pb ball electrode.
Figure 38B:
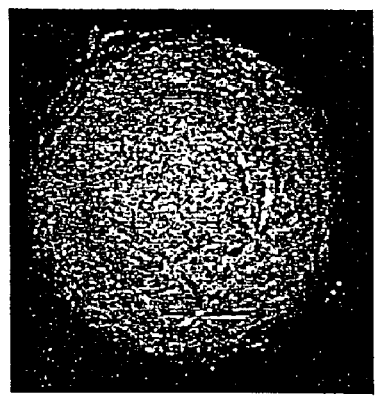
Figure 38C:
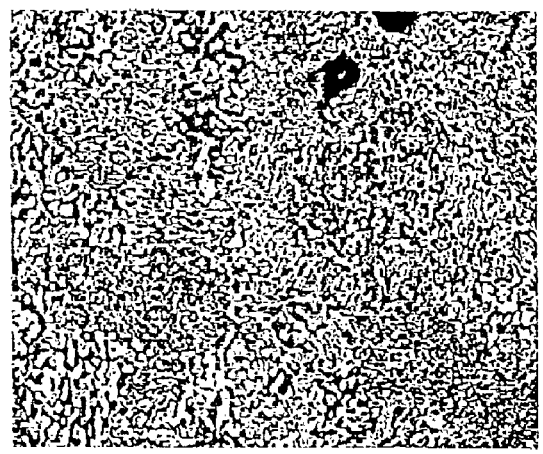

The Sn—37Pb ball electrode shown in FIGS. 38A through 38C is in a shape the closest to a sphere among the five kinds of ball electrodes and its position can be identified through the laser irradiation. A hole that may be a shrinkage cavity is found and radially extending lines are found.

From a viewpoint of the position identification through the laser irradiation, the Sn—8Zn—3Bi ball electrode, the Sn—9Zn—1In ball electrode and the Sn—3Ag—0.5Cu ball electrode can be regarded as the same level.

Next, observation of voids in a ball electrode will be described. Before the heat cycle test, the photograph of each ball electrode is shot by X-ray radiography. As a result, it is found that voids are caused within the balls in most of the combinations of the ball electrodes and the solder pastes other than the combination of Sn—Pb eutectic solders. In particular, a large number of voids are formed in every combination including Zn in either the ball electrode or the solder paste.

The combinations of the ball electrodes and the solder pastes employed for the observation of the voids are the same as those listed in Table 2, and the void rates of the respective combinations are as follows, whereas the void rate corresponds to a rate of formation of the voids in 4410 balls:

(1) In the case of Sn—8Zn—3Bi ball electrode:
Sn—8Zn—3Bi paste: 99.3%
Sn—3Ag—0.5Cu paste: 98.8%
Sn—37Pb paste: 100%
(2) In the case of Sn—3Ag—0.5Cu ball electrode:
Sn—8Zn—3Bi paste: 51.9%
Sn—3Ag—0.5Cu paste: 96.8%
Sn—37Pb paste: 0.0%

(3) In the case of Sn—37Pb ball electrode:
Sn—8Zn—3Bi paste: 96.2%
Sn—3Ag—0.5Cu paste: 48.5%
Sn—37Pb paste: 0.0%

In the ball electrodes having the compositions other than the Zn-based composition, there is tendency that some voids with a small diameter are collectively formed. On the other hand, in the ball electrodes of the Zn-based composition, a large number of voids have a large diameter occupying a half or more of the cross-sectional area of each ball. Considering that no voids are found in a daisy-chain sample obtained before the substrate packaging (namely, a BGA package having a ball electrode obtained before supply to the packaging maker), the factors in causing the voids seem to be largely concerned with the conditions for the reflow process and the flux. In the case where at least one of the ball electrode, the solder paste and the solder composition includes Zn, the formation of voids is presumed to lead to a problem in an actual device (assembly) and in the packaging process. Therefore, it is very significant to suppress or reduce the formation of voids by using the technique described in Embodiment 2.

What is claimed is:

1. A semiconductor device comprising:
a semiconductor element having a plurality of electrodes, and
a ball electrode electrically connected to at least one of the plurality of electrodes through a wiring board having a top face and a rear face,
wherein the semiconductor element is mounted on the top face of the wiring board and the ball electrode is connected to a gold plated rear electrode on the rear face of the wiring board,
wherein the ball electrode comprises a Sn—Zn-based lead-free solder including 7 through 9.5 wt % of zinc and the remainder tin, and
wherein the thickness of the gold plating is more than 0 and less than 0.5 $\mu$m.

2. A semiconductor device comprising:
a semiconductor element having a plurality of electrodes, and
a ball electrode electrically connected to at least one of the plurality of electrodes through a wiring board having a top face and a rear face,
wherein the semiconductor element is mounted on the top face of the wiring board and the ball electrode is connected to a gold plated rear electrode on the rear face of the wiring board,
wherein the ball electrode comprises a Sn—Zn-based lead-free solder including 7 through 9.5 wt % of zinc, 1 through 5 wt % of bismuth and the remainder tin, and
wherein the thickness of the gold plating is more than 0 and less than 0.5 $\mu$m.

3. A semiconductor device comprising:
a semiconductor element having a plurality of electrodes, and
a ball electrode electrically connected to at least one of the plurality of electrodes through a wiring board having a top face and a rear face,
wherein the semiconductor element is mounted on the top face of the wiring board and the ball electrode is connected to a gold plated rear electrode on the rear face of the wiring board,
wherein the ball electrode comprises a Sn—Zn-based lead-free solder including 7 through 9.5 wt % of zinc, 1 through 5 wt % of indium and the remainder tin, and
wherein the thickness of the gold plating is more than 0 and less than 0.5 $\mu$m.

4. A semiconductor device comprising:
a semiconductor element having a plurality of electrodes, and
a ball electrode electrically connected to at least one of the plurality of electrodes through a wiring board having a top face and a rear face,
wherein the semiconductor element is mounted on the top face of the wiring board and the ball electrode is connected to a gold plated rear electrode on the rear face of the wiring board,
wherein the bail electrode comprises a Sn—Zn-based lead-free solder including 7 through 9.5 wt % of zinc, 1 through 4 wt % of bismuth, 1 through 4 wt % of indium and the remainder of tin, and
wherein the thickness of the gold plating is more than 0 and less than 0.5 $\mu$m.

5. A semiconductor device comprising:
a semiconductor element having a plurality of electrodes, and
a ball electrode electrically connected to at least one of the plurality of electrodes through a wiring board having a top face and a rear face,
wherein the semiconductor element is mounted on the top face of the wiring board and the ball electrode is connected to a gold plated rear electrode on the rear face of the wiring board,
wherein the ball electrode comprising a lead-free solder having a melting point of 180° C. through 200° C., and
wherein the thickness of the gold plating is more than 0 and less than 0.5 $\mu$m.

6. A semiconductor device comprising:
a semiconductor element having a plurality of electrodes and an insulating layer on a principal face of the semiconductor element;
a plurality of lands on the insulating layer electrically connected to the corresponding plurality of electrodes of the semiconductor, and
a ball electrode on at least one of the plurality of lands,
wherein the ball electrode comprises a Sn—Zn based lead-free solder and the land is gold plated wherein the gold plating is more than 0 and less than 0.5 $\mu$m.

7. The semiconductor device of any of claims 1–5, wherein the thickness of the gold plating is 0.3 $\mu$m or less.

8. The semiconductor device of claim 7, wherein the rear electrode has nickel plating, palladium plating and gold plating stacked in this order thereon with the ball electrode on top of the gold plating.

9. The semiconductor device of any of claims 1–5, wherein the ball electrode and the at least one of the plurality of electrodes are electrically connected through a copper or iron lead frame,
the semiconductor element is mounted onto a part of the lead frame, and
the rear electrode has nickel plating, palladium plating and gold plating stacked in this order thereon with the ball electrode on top of the gold plating.

10. The semiconductor device of claim 9, wherein a plurality of ball electrodes including the ball electrode are two-dimensionally arranged on the rear face of the wiring board.

11. The semiconductor device of claim 10,
wherein the ball electrode is positioned in the center of the plurality of two-dimensionally arranged ball electrodes.

12. The semiconductor device of claim 9,
wherein the semiconductor device comprises a plurality of ball electrodes electrically connected to the plurality of electrodes through the wiring board.

13. The semiconductor device of claim 12,
wherein the top face of the wiring board comprises a plurality of wiring electrodes, and each of the plurality of electrodes of the semiconductor element is electrically connected to a corresponding wiring electrode through a projecting electrode.

14. The semiconductor device of claim 12,
wherein the top face of the wiring board comprises a plurality of wiring electrodes, and each of the plurality of electrodes of the semiconductor element is electrically connected to a corresponding wiring electrode through a metal wire.

15. The semiconductor device of claim 9,
wherein the wiring board comprises an organic material.

16. The semiconductor device of claim 9,
wherein the wiring board comprises a ceramic material.

17. The semiconductor device of any of claims 1–5,
wherein the ball electrode and the at least one of the plurality of electrodes are electrically connected through a copper or iron lead frame, the semiconductor element is mounted onto a part of the lead frame, and
the rear electrode has alloy plating composed of tin and bismuth thereon with the ball electrode placed on top of the alloy.

18. The semiconductor device of claims 1–5,
wherein the lead-free solder is an alloy having a liquid-solid coexistence region.

19. An assembly comprising the semiconductor device according to any of claims 1–5 and a package substrate.

20. The assembly of claim 19,
wherein the package substrate has a conducting wire corresponding to the ball electrode of the semiconductor device, and
the semiconductor device and the package substrate are electrically connected to each other through a cream solder on the conducting wire and the solder ball of the semiconductor device.

21. The assembly of claim 20,
wherein nickel plating and gold plating are stacked in this order on a portion of the conducting wire underlying the cream solder.

22. The semiconductor device of claim 6,
wherein the insulating layer comprises a low elastic resin.

* * * * *